United States Patent
Yang et al.

(10) Patent No.: US 9,715,938 B2
(45) Date of Patent: Jul. 25, 2017

(54) NON-VOLATILE MEMORY WITH SUPPLEMENTAL SELECT GATES

(71) Applicant: SANDISK TECHNOLOGIES INC., Plano, TX (US)

(72) Inventors: Nian Niles Yang, Mountain View, CA (US); Jim Fitzpatrick, Sudbury, MA (US); Yiwei Song, Union City, CA (US)

(73) Assignee: SanDisk Technologies LLC, Plano, TX (US)

( * ) Notice: Subject to any disclaimer, the term of this patent is extended or adjusted under 35 U.S.C. 154(b) by 32 days.

(21) Appl. No.: 14/860,224

(22) Filed: Sep. 21, 2015

(65) Prior Publication Data

US 2017/0084345 A1    Mar. 23, 2017

(51) Int. Cl.
G11C 16/34 (2006.01)
G11C 16/26 (2006.01)
G11C 16/04 (2006.01)
G11C 16/14 (2006.01)

(52) U.S. Cl.
CPC .......... *G11C 16/34* (2013.01); *G11C 16/0483* (2013.01); *G11C 16/14* (2013.01); *G11C 16/26* (2013.01)

(58) Field of Classification Search
CPC ..... G11C 16/34; G11C 16/0483; G11C 16/14; G11C 16/26
See application file for complete search history.

(56) References Cited

U.S. PATENT DOCUMENTS

| | | |
|---|---|---|
| 6,479,851 B1 | 11/2002 | Lee |
| 7,079,437 B2 | 7/2006 | Hazama |
| 7,177,191 B2 | 2/2007 | Fasoli |
| 7,505,321 B2 | 3/2009 | Scheuerlein |
| 7,551,466 B2 | 6/2009 | Aritome |
| 7,888,731 B2 | 2/2011 | Kim |
| 8,018,782 B2 | 9/2011 | Park |
| 8,228,735 B2 | 7/2012 | Puzzilli |
| 8,243,518 B2 | 8/2012 | Oh |
| 8,503,213 B2 | 8/2013 | Chen |
| 8,861,282 B2 | 10/2014 | Dutta |

(Continued)

OTHER PUBLICATIONS

PCT International Search Report dated Oct. 22, 2013, International Application No. PCT/US2013/039505.

(Continued)

*Primary Examiner* — Huan Hoang
*Assistant Examiner* — Tri Hoang
(74) *Attorney, Agent, or Firm* — Vierra Magen Marcus LLP

(57) ABSTRACT

A non-volatile memory system includes a plurality of groups of connected non-volatile memory cells (e.g., charge trapping memory cells), a select line, and a plurality of select gates connected to the select line. Each select gate is connected at an end (e.g. source end or drain side) of one of the groups of memory cells. The system includes one or more control circuits that are configured to determine whether the select gates are abnormal. If a select gate is determined to be abnormal, then one of the memory cells connected to the select gate is converted to operate as a select gate. The system will then perform memory operations by operating the converted memory cell as a select gate.

20 Claims, 18 Drawing Sheets

(56) References Cited

U.S. PATENT DOCUMENTS

| | | |
|---|---|---|
| 8,867,271 B2 | 10/2014 | Li |
| 8,873,297 B2 | 10/2014 | Yamada |
| 8,908,435 B2 | 12/2014 | Li |
| 8,929,142 B2 | 1/2015 | Dong |
| 8,964,473 B2 | 2/2015 | Dong |
| 8,971,119 B2 | 3/2015 | Avila |
| 8,982,629 B2 | 3/2015 | Dutta |
| 8,988,941 B2 | 3/2015 | Avila |
| 9,015,407 B1 | 4/2015 | Dusija |
| 2005/0286301 A1 | 12/2005 | Mochizuki |
| 2009/0011560 A1 | 1/2009 | Aritome |
| 2009/0287879 A1 | 11/2009 | Oh |
| 2010/0124118 A1 | 5/2010 | Lee |
| 2010/0127320 A1 | 5/2010 | Nishihara |
| 2010/0214839 A1 | 8/2010 | Guzzi |
| 2011/0069550 A1 | 3/2011 | Maejima |
| 2011/0211392 A1 | 9/2011 | Kim |
| 2011/0249503 A1 | 10/2011 | Yamada |
| 2011/0307646 A1 | 12/2011 | Lee |
| 2011/0309430 A1 | 12/2011 | Purayath |
| 2012/0170375 A1 | 7/2012 | Sim |
| 2012/0201082 A1 | 8/2012 | Choy |
| 2012/0327713 A1 | 12/2012 | Parat |
| 2013/0322174 A1* | 12/2013 | Li .................... G11C 16/0483 365/185.09 |
| 2014/0198575 A1 | 7/2014 | Dutta |
| 2014/0247665 A1 | 9/2014 | Avila |
| 2014/0254277 A1 | 9/2014 | Dutta |
| 2014/0269079 A1* | 9/2014 | Kamigaichi ........... G11C 16/10 365/185.17 |
| 2014/0293701 A1 | 10/2014 | Dong |
| 2014/0369129 A1 | 12/2014 | Dutta |
| 2016/0071593 A1* | 3/2016 | Hashimoto ........... G11C 16/08 365/185.33 |

OTHER PUBLICATIONS

PCT Written Opinion of the International Searching Authority dated Oct. 22, 2013, International Application No. PCT/US2013/039505.
PCT International Search Report dated Apr. 11, 2014, International Application No. PCT/US2014/010664.
PCT Written Opinion of the International Searching Authority dated Apr. 11, 2014, International Application No. PCT/US2014/010664.

* cited by examiner

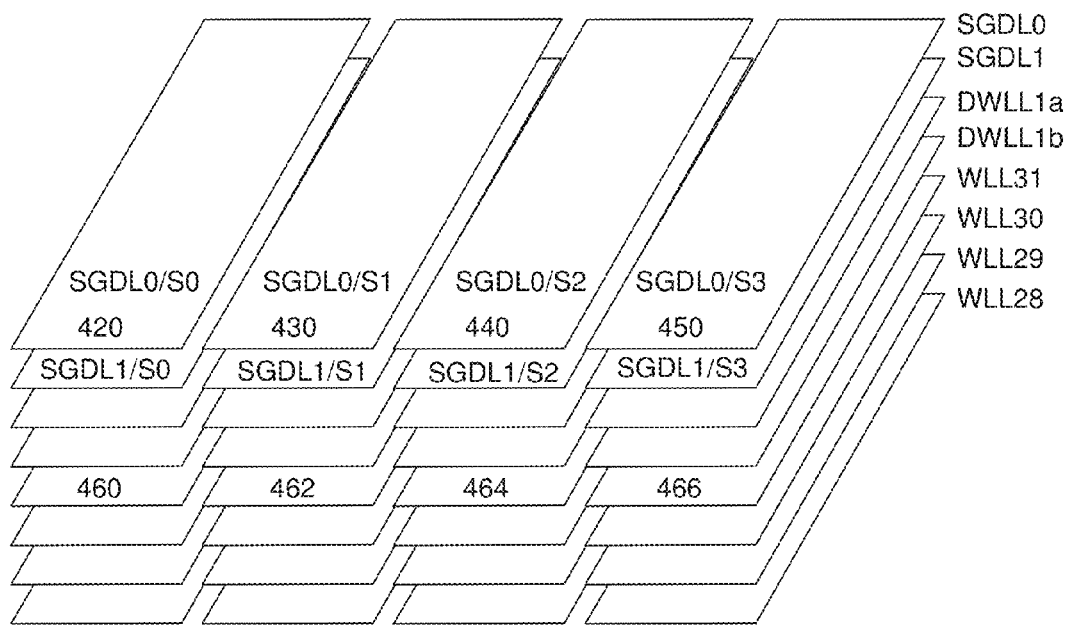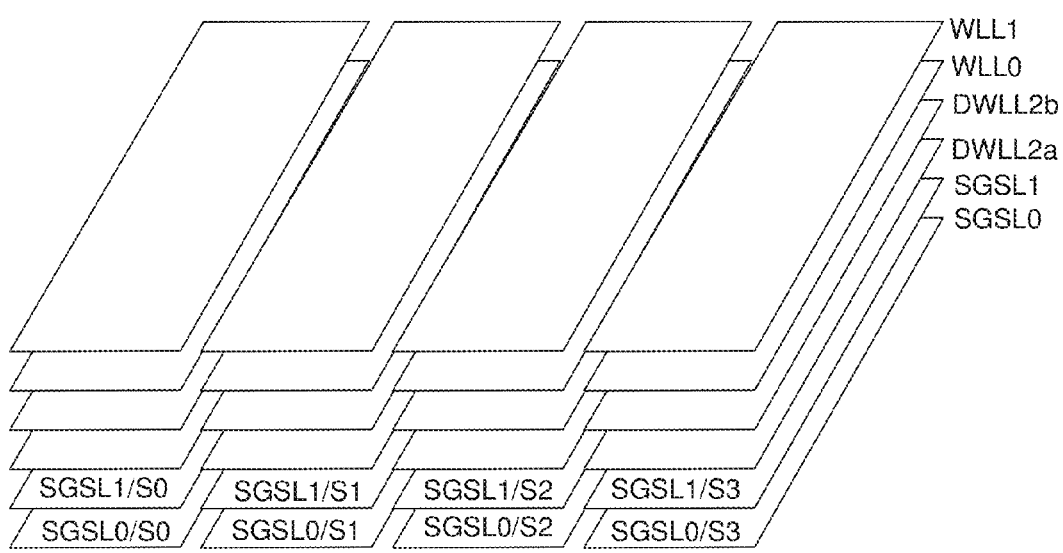
Figure 4D

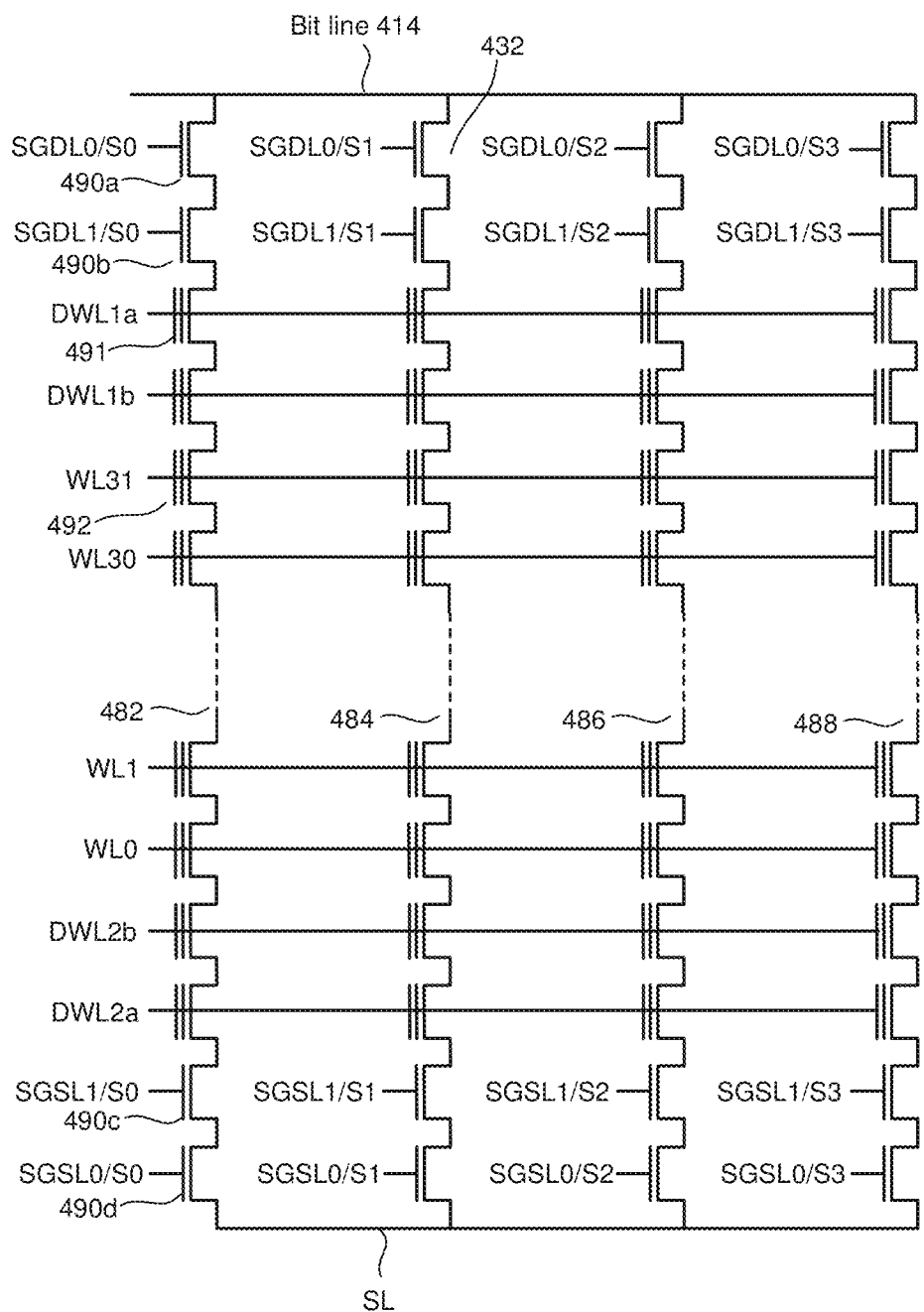

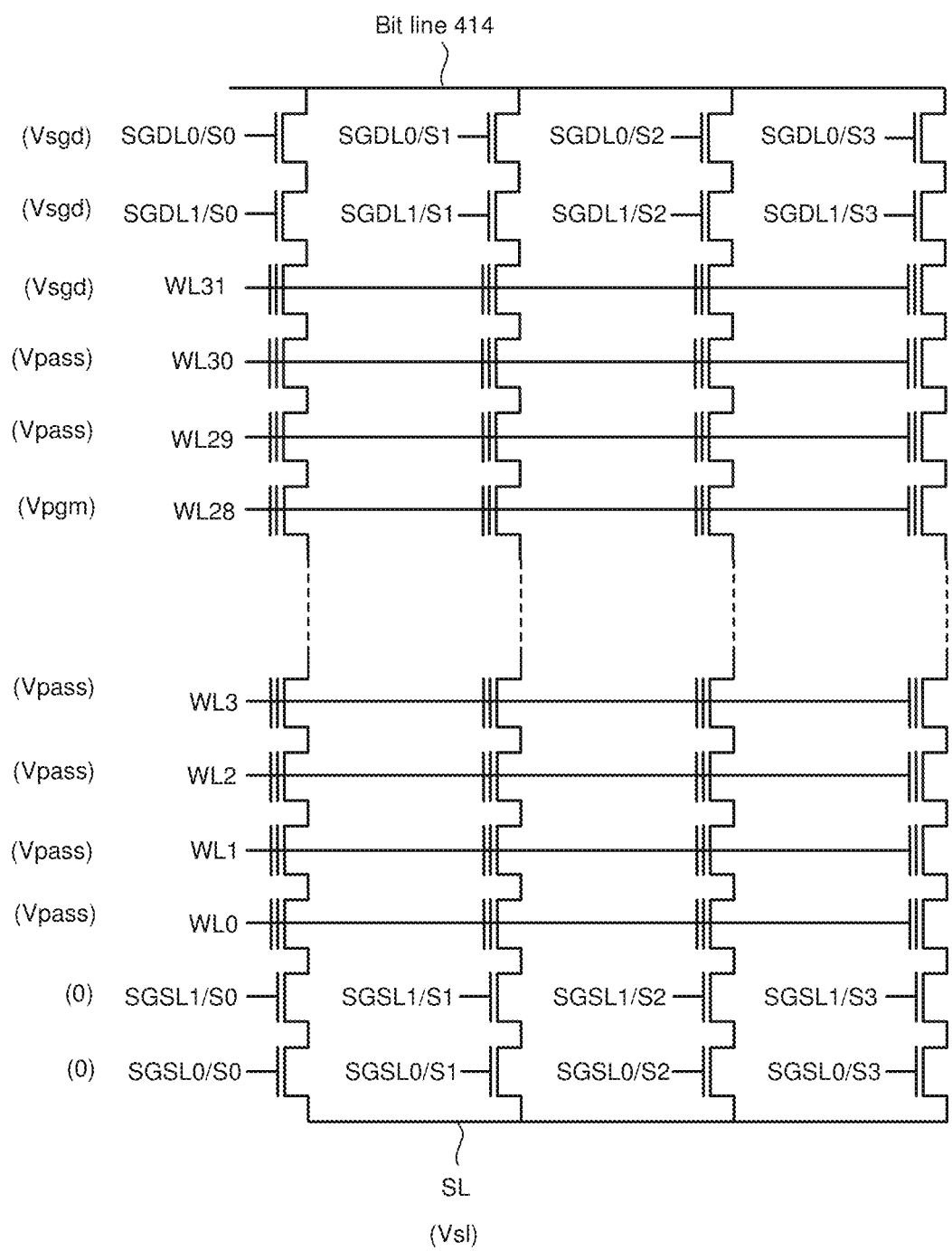

NON-VOLATILE MEMORY WITH SUPPLEMENTAL SELECT GATES

BACKGROUND

Semiconductor memory is widely used in various electronic devices such as cellular telephones, digital cameras, personal digital assistants, medical electronics, mobile computing devices, and non-mobile computing devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory) and Electrically Erasable Programmable Read-Only Memory (EEPROM).

A charge-trapping material can be used in non-volatile memory devices to store a charge which represents a data state. The charge-trapping material can be arranged vertically in a three-dimensional (3D) stacked memory structure. One example of a 3D memory structure is the Bit Cost Scalable (BiCS) architecture which comprises a stack of alternating conductive and dielectric layers. A memory hole is formed in the stack and a NAND string is then formed by filling the memory hole with materials including a charge-trapping layer to create a vertical column of memory cells. Each memory cell can store one or more bits of data.

Historically, data retention has been an issue to consider when designing non-volatile memory, including devices that use charge-trapping material. In terms of non-volatile memory, data retention can be thought of as the ability to maintain accurate storage of data over a period of time. With some non-volatile memory, the information stored in a memory cell can change (also known as drift) over time. With proper consideration during the design phase, this drift potentially experienced by memory cells storing user data can be accounted for so that errors are avoided.

BRIEF DESCRIPTION OF THE DRAWINGS

Like-numbered elements refer to common components in the different figures.

FIG. 4D depicts a view of the select gate layers and word line layers.

FIG. 4F is a schematic of a plurality of NAND strings.

FIG. 16 is a schematic of a plurality of NAND strings depicting one embodiment that uses user data memory cells as select gates.

DETAILED DESCRIPTION

Select gates can be used to select or unselect memory cells for memory operations. In some non-volatile memory systems, the select gate has charge-trapping material, a floating gate, a magnet, a switch or other structure that might also be found in a memory cell. Such a select gate may be prone to data retention issues, such as a change in operating properties dues to drift or an external force. Operation of the select gate may also impacted by other structural defects in the select gate or the connected select line. To prevent loss of a complete NAND string (or other group of memory cells), the select gates are tested to determine whether they have become abnormal. If a select gate is determined to be abnormal, then one of the memory cells connected to that select gate is converted, or reconfigured, to operate as a select gate. The system will then perform memory operations by operating the converted memory cell as a select gate. A select gate is abnormal if it has a structural defect, it is not operating in the manner it was intended to operate or it is in an unintended condition.

The following discussion provides details of one example of a suitable structure for a memory devices that can implement the proposed technology.

Figure 1:
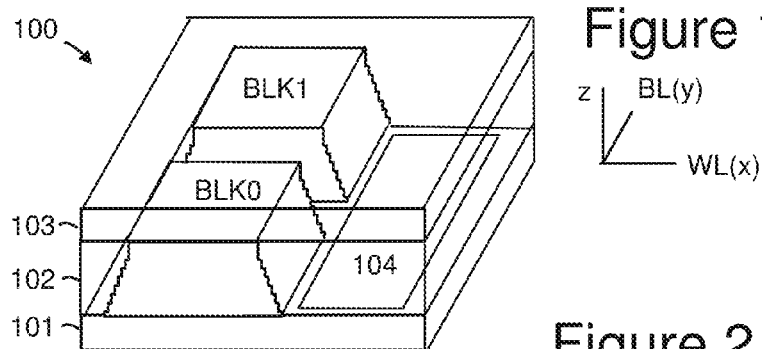
FIG. 1 is a perspective view of a 3D stacked non-volatile memory device.

FIG. 1 is a perspective view of a three dimensional (3D) stacked non-volatile memory device. The memory device 100 includes a substrate 101. On and above the substrate are example blocks BLK0 and BLK1 of memory cells (non-volatile storage elements). Also on substrate 101 is peripheral area 104 with support circuits for use by the blocks. Substrate 101 can also carry circuits under the blocks, along with one or more lower metal layers which are patterned in conductive paths to carry signals of the circuits. The blocks are formed in an intermediate region 102 of the memory device. In an upper region 103 of the memory device, one or more upper metal layers are patterned in conductive paths to carry signals of the circuits. Each block comprises a stacked area of memory cells, where alternating levels of the stack represent word lines. While two blocks are depicted as an example, additional blocks can be used, extending in the x- and/or y-directions.

In one example implementation, the length of the plane in the x-direction, represents a direction in which signal paths for word lines extend (a word line or SGD line direction), and the width of the plane in the y-direction, represents a direction in which signal paths for bit lines extend (a bit line direction). The z-direction represents a height of the memory device.

Figure 2:
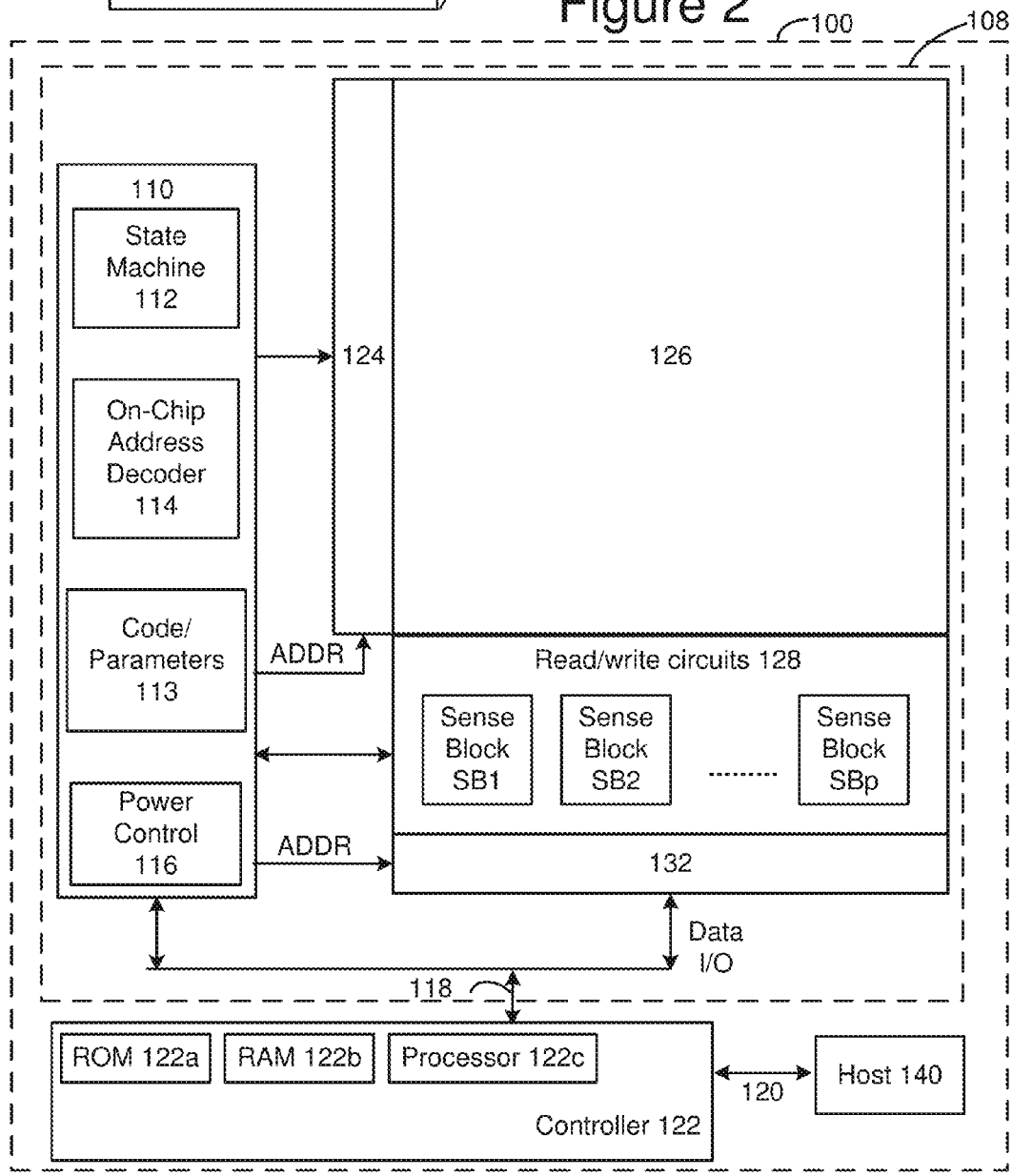
FIG. 2 is a functional block diagram of a memory device such as the 3D stacked non-volatile memory device 100 of FIG. 1.

FIG. 2 is a functional block diagram of an example memory device such as the 3D stacked non-volatile memory device 100 of FIG. 1. The components depicted in FIG. 2 are electrical circuits. Memory device 100 includes one or more memory die 108. Each memory die 108 includes a three dimensional memory structure 126 of memory cells (such as, for example, a 3D array of memory cells), control circuitry 110, and read/write circuits 128. In other embodiments, a two dimensional array of memory cells can be used. Memory structure 126 is addressable by word lines via a row decoder 124 and by bit lines via a column decoder 132. The read/write circuits 128 include multiple sense blocks SB1, SB2, . . . , SBp (sensing circuitry) and allow a page of memory cells to be read or programmed in parallel. In some systems, a controller 122 is included in the same memory device 100 (e.g., a removable storage card) as the one or more memory die 108. However, in other systems, the controller can be separated from the memory die 108. In some embodiments, one controller 122 will communicate with multiple memory die 108. In other embodiments, each memory die 108 has its own controller. Commands and data are transferred between the host 140 and controller 122 via a data bus 120, and between controller 122 and the one or more memory die 108 via lines 118. In one embodiment, memory die 108 includes a set of input and/or output (I/O) pins that connect to lines 118.

Memory structure 126 may comprise one or more arrays of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

Control circuitry 110 cooperates with the read/write circuits 128 to perform memory operations (e.g., erase, program, read, and others) on memory structure 126, and includes a state machine 112, an on-chip address decoder 114, and a power control module 116. The state machine 112 provides chip-level control of memory operations. Code and parameter storage 113 may be provided for storing operational parameters and software. In one embodiment, state machine 112 is programmable by the software stored in code and parameter storage 113. In other embodiments, state machine 112 does not use software and is completely implemented in hardware (e.g., electronic circuits).

The on-chip address decoder 114 provides an address interface between addresses used by host 140 or memory controller 122 to the hardware address used by the decoders 124 and 132. Power control module 116 controls the power and voltages supplied to the word lines and bit lines during memory operations. It can include drivers for word line layers (discussed below) in a 3D configuration, select transistors (e.g., SGS and SGD transistors, described below) and source lines. Power control module 116 may include charge pumps for creating voltages. The sense blocks include bit line drivers. An SGS transistor is a select gate transistor at a source end of a NAND string, and an SGD transistor is a select gate transistor at a drain end of a NAND string.

Any one or any combination of control circuitry 110, state machine 112, decoders 114/124/132, code and parameter storage 113, power control module 116, sense blocks SB1, SB2, . . . , SBp, read/write circuits 128, and controller 122 can be considered one or more control circuits that performs the functions described herein.

The (on-chip or off-chip) controller 122 may comprise a processor 122c and storage devices (memory) such as ROM 122a and RAM 122b. The storage devices comprises code such as a set of instructions, and the processor 122c is operable to execute the set of instructions to provide the functionality described herein. Alternatively or additionally, processor 122c can access code from a storage device in the memory structure, such as a reserved area of memory cells connected to one or more word lines.

Multiple memory elements in memory structure 126 may be configured so that they are connected in series or so that each element is individually accessible. By way of non-limiting example, flash memory devices in a NAND configuration (NAND flash memory) typically contain memory elements connected in series. A NAND string is an example of a set of series-connected memory cells and select gate transistors.

A NAND flash memory array may be configured so that the array is composed of multiple NAND strings of which a NAND string is composed of multiple memory cells sharing a single bit line and accessed as a group. Alternatively, memory elements may be configured so that each element is individually accessible, e.g., a NOR memory array. NAND and NOR memory configurations are exemplary, and memory cells may be otherwise configured.

The memory cells may be arranged in the single memory device level in an ordered array, such as in a plurality of rows and/or columns. However, the memory elements may be arrayed in non-regular or non-orthogonal configurations, or in structures not considered arrays.

A three dimensional memory array is arranged so that memory cells occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory cells. The vertical columns may be arranged in a two dimensional configuration, e.g., in an x-y plane, resulting in a three dimensional arrangement of memory cells, with memory cells on multiple vertically stacked memory planes. Other configurations of memory elements in three dimensions can also constitute a three dimensional memory array.

By way of non-limiting example, in a three dimensional NAND memory array, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

A person of ordinary skill in the art will recognize that this technology is not limited to a single specific memory structure, but covers many relevant memory structures within the spirit and scope of the technology as described herein and as understood by one of ordinary skill in the art.

Figure 3A:
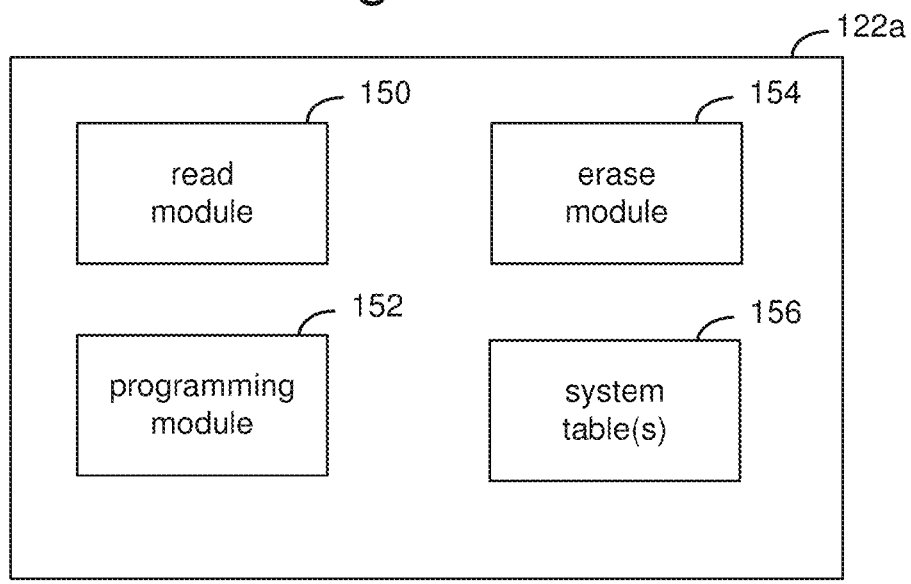
FIG. 3A is a block diagram depicting software modules for programming one or more processors in a Controller.

FIG. 3A is a block diagram depicting software modules for operating one or more processors in controller 122. FIG. 3A depicts read module 150, programming module 152, erase module 154 and system tables(s) 156 being stored in ROM 122a; however, these components can also be stored in RAM or memory die 108. Read module 150 includes software that programs processor(s) 122C to perform read operations. Programming module 152 includes software that programs processor(s) 122C to perform programming operations (including verification of programming). Erase module 154 includes software that programs processor(s) 122C to perform erase operations. System table(s) 156 are one example of a suitable data structure that can store information about (including indications of) select gates that are abnormal, select lines connected to abnormal select gates, blocks that have abnormal select gates, word lines that are serving as supplemental word lines and/or memory cells that are being used as supplemental select gates. More information about tables(s) 156 are provided below. Based on the software and the table(s), controller 122 instructs memory die 108 to perform memory operations.

Figure 3B:
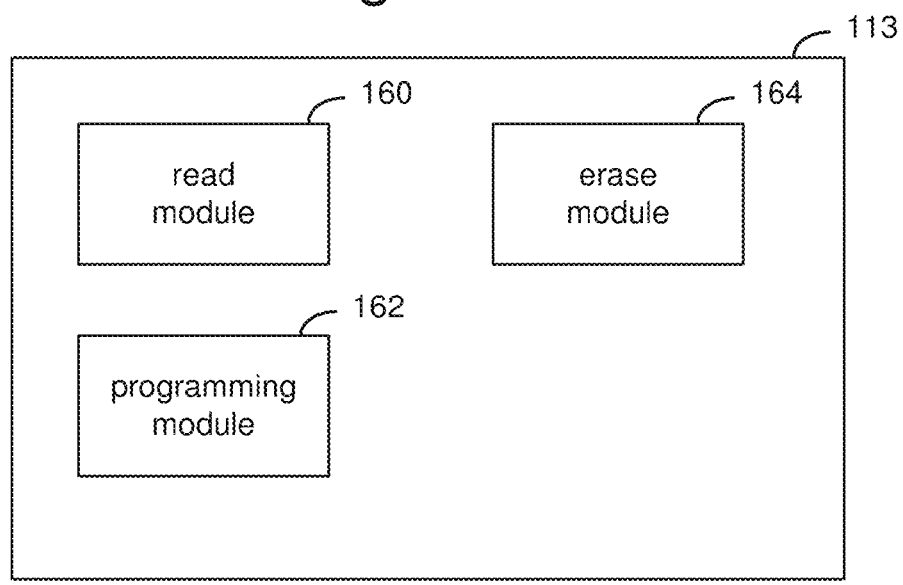
FIG. 3B is a block diagram depicting software modules for programming a state machine or other processor on a memory die.

FIG. 3B is a block diagram depicting software modules for programming state machine 112 (or other processor on memory die 108). FIG. 3B depicts read module 160, programming module 162, and erase module 164 being stored in code and parameter storage 113. These software modules can also be stored in RAM or in memory structure 126. Read module 160 includes software that programs state machine 112 to perform read operations. Programming module 152 includes software that programs state machine 112 to perform programming operations (including verification of programming). Erase module 154 includes software that programs state machine 112 to perform erase operations. Alternatively, state machine 112 (which is an electronic circuit) can be completely implemented with hardware so that no software is needed to perform these functions.

Figure 4A:
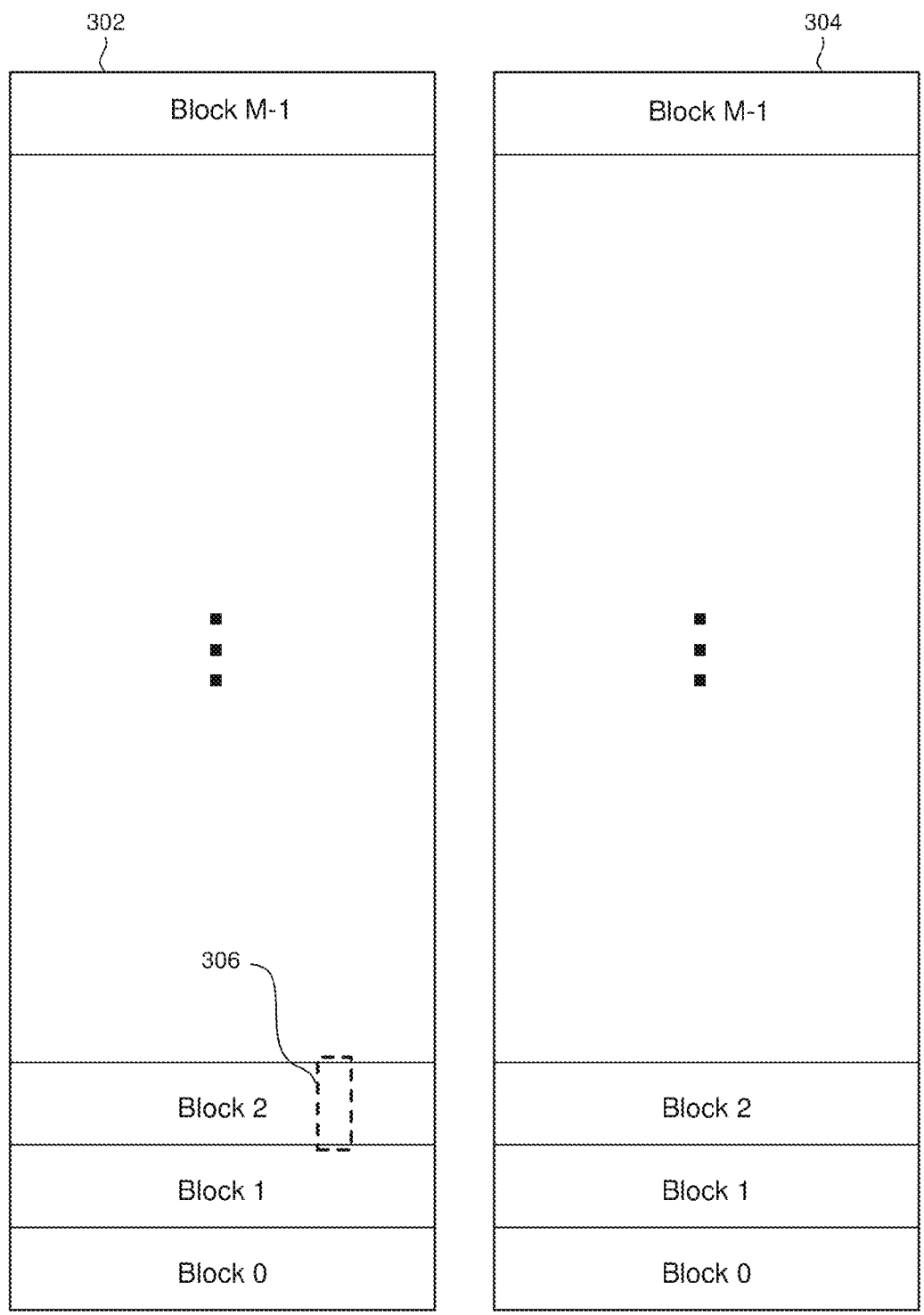
FIG. 4A is a block diagram of a memory structure having two planes.

FIG. 4A is a block diagram explaining one example organization of memory structure 126, which is divided into two planes 302 and 304. Each plane is then divided into M blocks. In one example, each plane has about 2000 blocks. However, different numbers of blocks and planes can also be used.

Figure 4B:
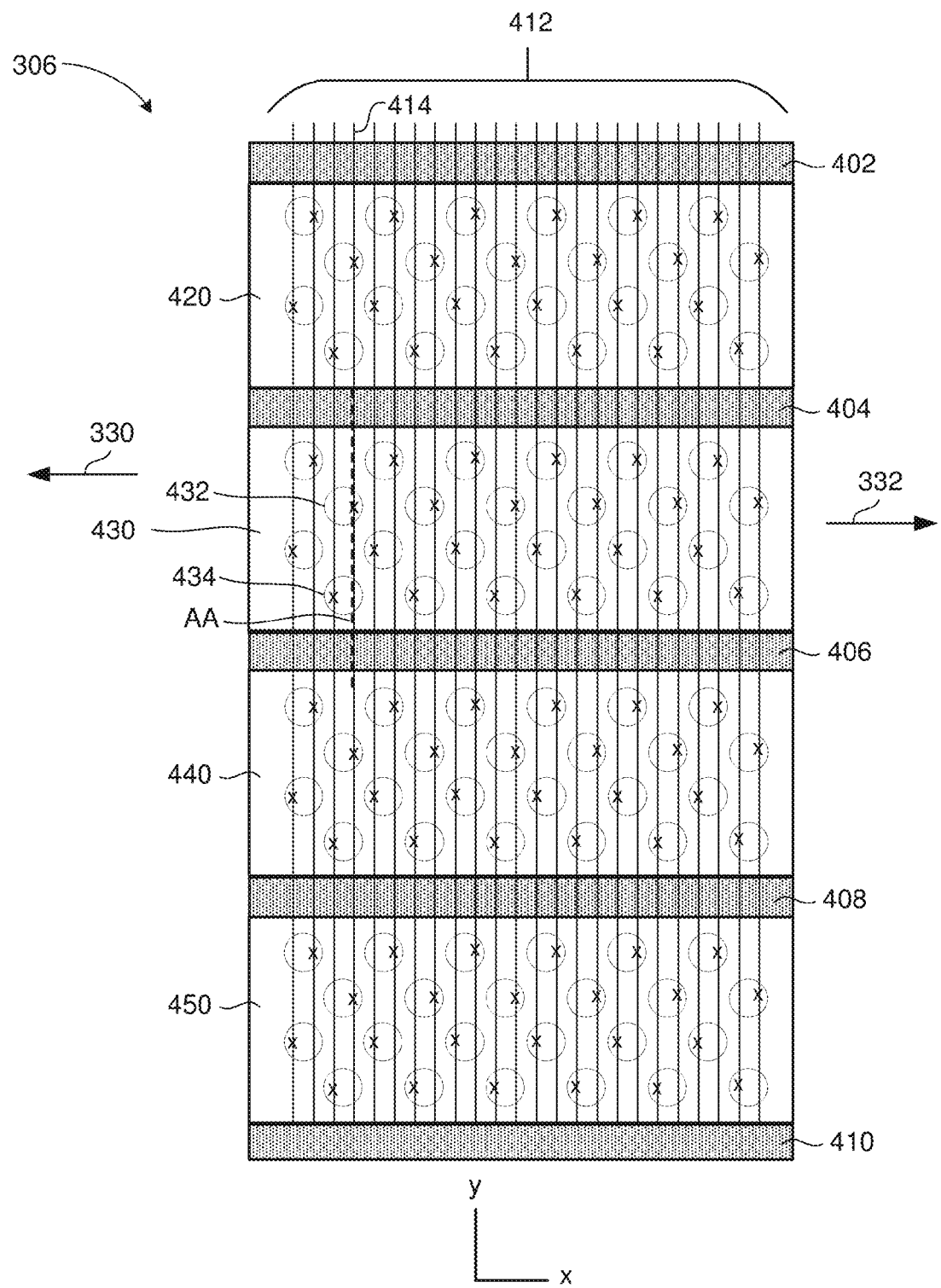
FIG. 4B depicts a top view of a portion of a block of memory cells.

FIGS. 4B-4E depict an example 3D NAND structure. FIG. 4B is a block diagram depicting a top view of a portion of one block from memory structure 126. The portion of the block depicted in FIG. 4B corresponds to portion 306 in block 2 of FIG. 4A. As can be seen from FIG. 4B, the block depicted in FIG. 4B extends in the direction of arrow 330 and in the direction of arrow 332. In one embodiment, the memory array will have 48 layers. Other embodiments have less than or more than 48 layers. However, FIG. 4B only shows the top layer.

FIG. 4B depicts a plurality of circles that represent the vertical columns. Each of the vertical columns include multiple select transistors and multiple memory cells. In one embodiment, each vertical column implements a NAND string. More details of the vertical columns are provided below. Since the block depicted in FIG. 4B extends in the direction of arrow 330 and in the direction of arrow 332, the block includes more vertical columns than depicted in FIG. 4B FIG. 4B also depicts a set of bit lines 412. FIG. 4B shows twenty four bit lines because only a portion of the block is depicted. It is contemplated that more than twenty four bit lines connected to vertical columns of the block. Each of the circles representing vertical columns has an "x" to indicate its connection to one bit line.

The block depicted in FIG. 4B includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 4B is divided into regions 420, 430, 440 and 450, which are referred to as fingers. In the layers of the block that implement memory cells, the four regions are referred to as word line fingers that are separated by the local interconnects. In one embodiment, the word line fingers on a common level of a block connect together at the end of the block to form a single word line. In another embodiment, the word line fingers on the same level are not connected together. In one example implementation, a bit line only connects to one vertical column in each of regions 420, 430, 440 and 450. In that implementation, each block has sixteen rows of active columns and each bit line connects to four rows in each block. In one embodiment, all of four rows connected to a common bit line are connected to the same word line (via different word line fingers on the same level that are connected together); therefore, the system uses the source side select lines and the drain side select lines to choose one (or another subset) of the four to be subjected to a memory operation (program, verify, read, and/or erase).

Although FIG. 4B shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block.

FIG. 4B also shows the vertical columns being staggered. In other embodiments, different patterns of staggering can be used. In some embodiments, the vertical columns are not staggered.

Figure 4C:
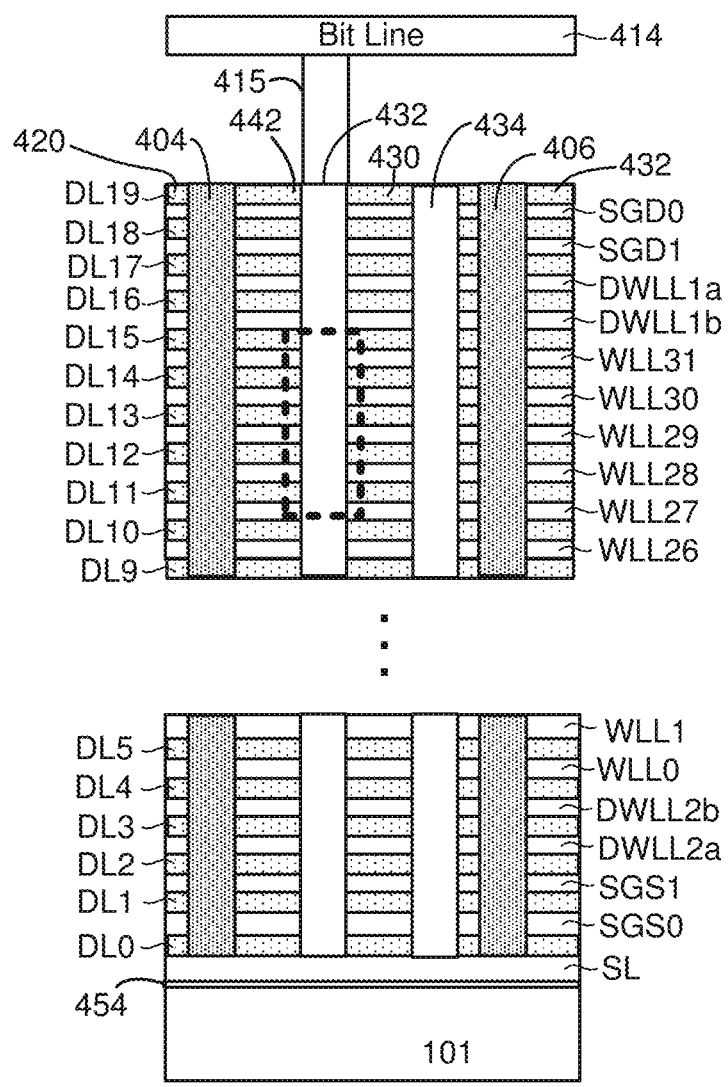
FIG. 4C depicts a cross sectional view of a portion of a block of memory cells.

FIG. 4C depicts a portion of an embodiment of three dimensional memory structure 126 showing a cross-sectional view along line AA of FIG. 4B. This cross sectional view cuts through vertical columns 432 and 434 and region 430 (see FIG. 4B). The structure of FIG. 4C includes two drain side select layers SGD0 and SGD1; two source side select layers SGS0 and SGS1; four dummy word line layers DWLL1a, DWLL1b, DWLL2a and DWLL2b; and thirty two word line layers WLL0-WLL31 for connecting to data memory cells. Other embodiments can implement more or less than two drain side select layers, more or less than two source side select layers, more or less than four dummy word line layers, and more or less than thirty two word line layers. Vertical columns 432 and 434 are depicted protruding through the drain side select layers, source side select layers, dummy word line layers and word line layers. In one embodiment, each vertical column comprises a NAND string. Below the vertical columns and the layers listed below is substrate 101, an insulating film 454 on the substrate, and source line SL. The NAND string of vertical column 432 has a source end at a bottom of the stack and a drain end at a top of the stack. As in agreement with FIG. 4B, FIG. 4C show vertical column 432 connected to Bit Line 414 via connector 415. Local interconnects 404 and 406 are also depicted.

For ease of reference, drain side select layers SGD0 and SGD1; source side select layers SGS0 and SGS1; dummy word line layers DWLL1a, DWLL1b, DWLL2a and DWLL2b; and word line layers WLL0-WLL31 collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL19. For example, dielectric layers DL10 is above word line layer WLL26 and below word line layer WLL27. In one embodiment, the dielectric layers are made from $SiO_2$. In other embodiments, other dielectric materials can be used to form the dielectric layers.

The memory cells are formed along vertical columns which extend through alternating conductive and dielectric layers in the stack. In one embodiment, the memory cells are arranged in NAND strings. The word line layer WLL0-WLL31 connect to memory cells (also called data memory cells). Dummy word line layers DWLL1a, DWLL1b, DWLL2a and DWLL2b connect to dummy memory cells. A dummy memory cell does not store user data, while a data memory cell is eligible to store user data. Drain side select layers SGD0 and SGD1 are used to electrically connect and disconnect NAND strings from bit lines. Source side select layers SGS0 and SGS1 are used to electrically connect and disconnect NAND strings from the source line SL.

FIG. 4D depicts a logical representation of the conductive layers (SGD0, SGD1, SGS0, SGS1; DWLL1a, DWLL1b, DWLL2a, DWLL2b, and WLL0-WLL31) for the block that is partially depicted in FIG. 4C. As mentioned above with respect to FIG. 4B, in one embodiment local interconnects 401, 404, 406, 408 and 410 break up each conductive layers into four regions. For example, word line layer WLL31 is divided into regions 460, 462, 464 and 466. For word line layers (WLL0-WLL31), the regions are referred to as word line fingers; for example, word line layer WLL31 is divided into word line fingers 460, 462, 464 and 466. In one embodiment, each word line finger operates as a separate word line. In another embodiment, the four word line fingers on a same level are connected together.

Drain side select gate layer SGDL0 (the top layer) is also divided into regions 420, 430, 440 and 450, also known as fingers or select line fingers. In one embodiment, each of the select line finger operates as a separate word line; therefore, region 420 is labeled as select line SGDL0/S0 (ie select line 0 of drain side select line layer 0), region 430 is labeled as select line SGDL0/S1 (ie select line 1 of drain side select line layer 0), region 440 is labeled as select line SGDL0/S2, and region 450 is labeled as select line SGDL0/S3. Similarly, drain side select gate layer SGDL1 has four fingers that operate as select lines SGDL1/S0, SGDL1/S1, SGDL1/S2, and SGDL1/S3. Source side select gate layer SGSL0 has four fingers that operate as select lines SGSL0/S0, SGSL0/S1, SGSL0/S2, and SGSL0/S3. Source side select gate layer SGSL1 has four fingers that operate as select lines SGSL1/S0, SGSL1/S1, SGSL1/S2, and SGSL1/S3.

Figure 4E:
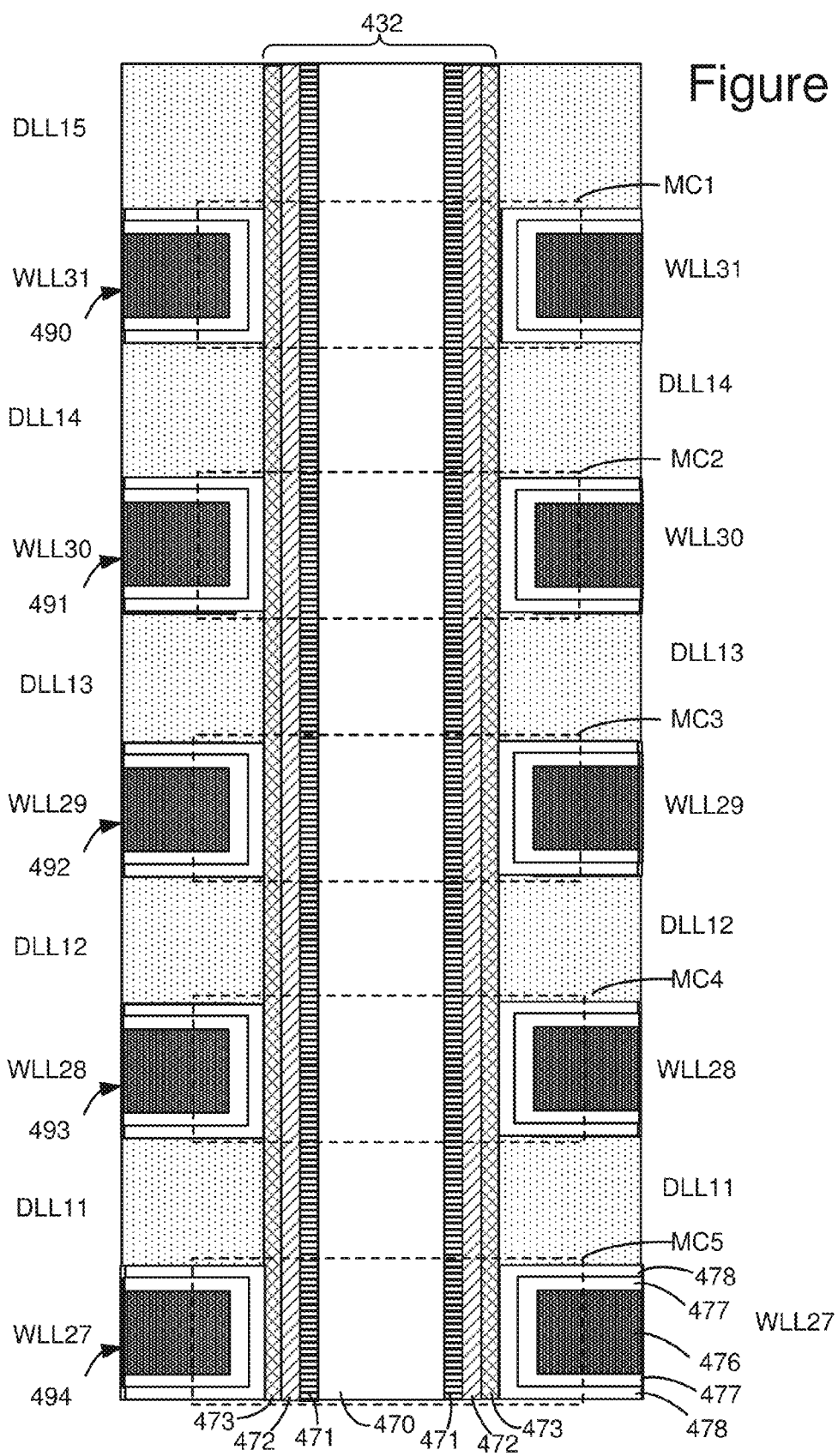
FIG. 4E is a cross sectional view of a vertical column of memory cells.

FIG. 4E depicts a cross sectional view of region 442 of FIG. 4C that includes a portion of vertical column 432. In one embodiment, the vertical columns are round and include four layers; however, in other embodiments more or less than four layers can be included and other shapes can be used. In one embodiment, vertical column 432 includes an inner core layer 470 that is made of a dielectric, such as $SiO_2$. Other materials can also be used. Surrounding inner core 470 is polysilicon channel 471. Materials other than polysilicon can also be used. Note that it is the channel 471 that connects to the bit line. Surrounding channel 471 is a tunneling dielectric 472. In one embodiment, tunneling dielectric 472 has an ONO structure. Surrounding tunneling dielectric 472 is charge trapping layer 473, such as (for example) a specially formulated silicon nitride that increases trap density.

FIG. 4E depicts dielectric layers DLL11, DLL12, DLL13, DLL14 and DLL15, as well as word line layers WLL27, WLL28, WLL29, WLL30, and WLL31. Each of the word line layers includes a word line region 476 surrounded by an aluminum oxide layer 477, which is surrounded by a blocking oxide ($SiO_2$) layer 478. The physical interaction of the word line layers with the vertical column forms the memory cells. Thus, a memory cell, in one embodiment, comprises channel 471, tunneling dielectric 472, charge trapping layer 473, blocking oxide layer 478, aluminum oxide layer 477 and word line region 476. For example, word line layer WLL31 and a portion of vertical column 432 comprise a memory cell MC1. Word line layer WLL30 and a portion of vertical column 432 comprise a memory cell MC2. Word line layer WLL29 and a portion of vertical column 432 comprise a memory cell MC3. Word line layer WLL28 and a portion of vertical column 432 comprise a memory cell MC4. Word line layer WLL27 and a portion of vertical column 432 comprise a memory cell MC5. In other architectures, a memory cell may have a different structure; however, the memory cell would still be the storage unit.

When a memory cell is programmed, electrons are stored in a portion of the charge trapping layer 473 which is associated with the memory cell. These electrons are drawn into the charge trapping layer 473 from the channel 471, through the tunneling layer 473, in response to an appropriate voltage on word line region 476. The threshold voltage (Vth) of a memory cell is increased in proportion to the amount of stored charge. During an erase operation, the electrons return to the channel or holes are injected into the charge trapping layer to recombine with electrons.

FIG. 4F is a circuit diagram depicting a plurality of groups of connected programmable and erasable non-volatile memory cells arranged as four NAND strings 482, 484, 486 and 488 connected to bit line 414 and source line SL. The select lines SGDL0/S0, SGDL0/S1, SGDL0/S2, SGDL0/S3, SGDL1/S0, SGDL1/S1, SGDL1/S2, SGDL1/S3, SGSL0/S0, SGSL0/S1, SGSL0/S2, SGSL0/S3, SGSL1/S0, SGSL1/S1, SGSL1/S2, and SGSL1/S3 are used to select/unselect the depicted NAND strings. In one embodiment, there are two select lines (and, therefore, two select gates) on each side of each NAND string. Other embodiments can use more than two select lines (and two select gates) on each side or less than two select lines (and two select gates) on each side of the NAND strings. In the embodiment depicted in FIG. 4F, to connect a NAND string to the bit line (or the source line), both select gates must be actuated (via the two respective select lines). For example, to connect NAND string 482 to bit line 414, select gates 490a and 490b must be turned on (via select lines SGDL0/S0 and SGDL1/S0) and to connect NAND string 482 to source line SL, select gates 490c and 490d must be turned on (via select lines SGSL1/S0 and SGSL0/S0).

Although the example memory system discussed above is a three dimensional memory structure that includes vertical NAND strings with charge-trapping material, other (2D and 3D) memory structures can also be used with the technology described herein. For example, floating gate memories (e.g., NAND-type and NOR-type flash memory ReRAM memories, magnetoresistive memory (e.g., MRAM), and phase change memory (e.g., PCRAM) can also be used.

One example of a ReRAM memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. This configuration is known as a spin valve and is the simplest structure for an MRAM bit. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCRAM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

Looking back at FIG. 4F, in one embodiment the structure of the select gates (e.g., 490a, 490b, 490c, 490d, and others) are the same as memory cells (including data memory cells and dummy memory cells). That is, these select gates have charge trapping layers. In one example implementation, the select gates are programmed once, such as during manufacturing or testing (e.g., die sort), in order to set the threshold voltage of the select gate to be within a predetermined range for proper operation of a select gate. However, select gates (like memory cells) are subject to data retention problems and, therefore, the threshold voltage of these select gates can drift/change (e.g., electrons can escape the charge-trapping layers) so that the threshold voltage is no longer within the predetermined range for proper operation of a select gate. When this happens, the select gate is said to be abnormal. Other defects (e.g., broken word line, other structural defects in the select gate, etc.) can also cause a select gate to be abnormal. As used herein, an abnormal select gate refers to a select gate that either has or has developed a short, a defect, a flaw, or other impediment that prevents or contributes to preventing a select gate from holding and/or maintaining a threshold voltage within the predetermined range for proper operation of a select gate.

If a select gate is abnormal, then the select gate may not operate as intended, meaning that a NAND string may not be connected to a bit line or source line when it is supposed to be, or it may be connected when it is not supposed to be. Either situation causes an error. To prevent loss of a complete NAND string (or other groups of one or more memory cells—for embodiments that do not implement NAND strings), the select gates are tested to determine whether they have become abnormal. If a select gate is determined to be abnormal, then one of the memory cells connected to that select gate is converted to operate as a replacement select gate, as the replacement select gate will now perform the duties of the original select gate. The system will then perform memory operations by operating the converted memory cell as a select gate.

Figure 5:
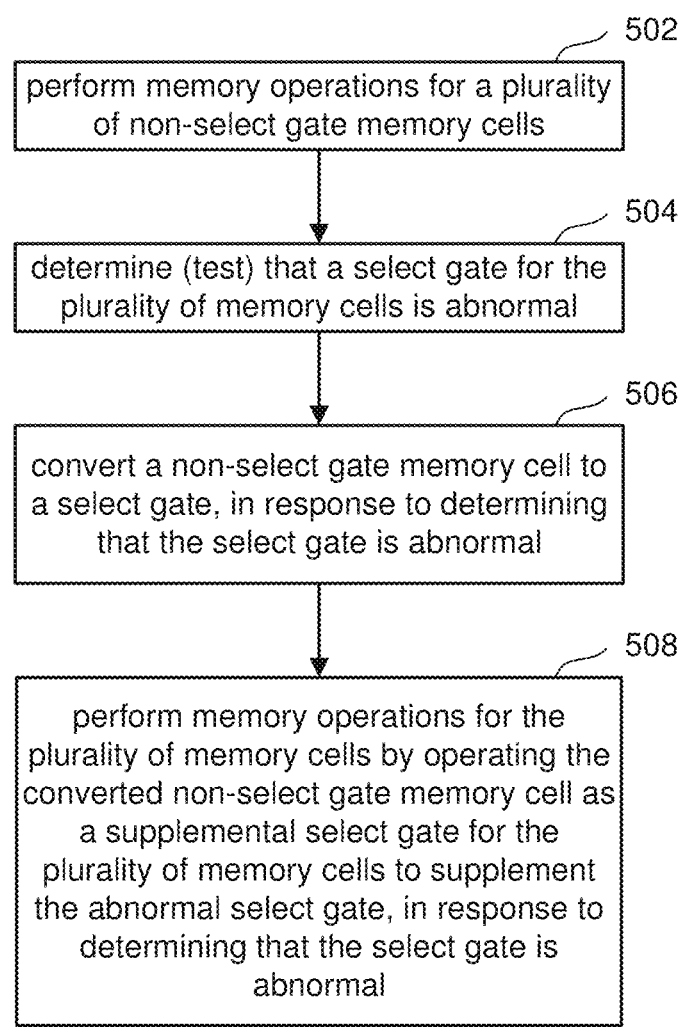
FIG. 5 is a flow chart describing one embodiment of operating non-volatile storage.

FIG. 5 is a flowchart describing one embodiment of a process for operating nonvolatile memory that implements a proposed technology described herein for detecting and supplementing abnormal select gates. In step 502, the system will perform memory operations for plurality of non-select gate memory cells. In one embodiment, memory operations include programming, erasing, otherwise changing a state or condition and/or reading. Non-select gate memory cells are memory cells that are not select gates, including user data memory cells and dummy memory cells. In step 504, the system tests whether the select gates for the memory cells are abnormal. For example, looking back at FIG. 4F, the non-select gate memory cells include those memory cells connected to the word lines WL0-WL31, as well as the dummy word lines. The select gates are those devices connected to the select lines (SGDL0/S0, SGDL0/S1, . . . ). In one embodiment, step 502 includes programming, erasing and/or reading memory cells connected to WL0-WL31, and step 504 includes determining whether the select gates connected to the select lines have their operation impaired because of drifts in their threshold voltage or any other structural defects. In step 506, the system will convert a non-select gate memory cell to become a select gate in response determining that the corresponding select gate is abnormal. In one embodiment, the non-select gate memory cell that is converted will be a dummy memory cell. In another embodiment, the non-select gate that is converted to become a select gate will be a user data memory cell. For example, if step 504 determined that select gate 490b (see FIG. 4F) has become abnormal, then step 506 may, for example, convert memory cell 491 (a dummy memory cell) or memory cell 492 (a user data memory cell) to become a select gate. In step 508, the system will perform memory operations for the plurality of memory cells by operating the converted non-select gate memory cell (which has been converted to become a select gate) as a supplemental select gate for the plurality of memory cells to supplement the abnormal select gate, in a response determining that the select gate is abnormal. Therefore, using the example described above, when performing additional memory operations on NAND string 482 of FIG. 4F, one embodiment will use memory cell 491 as a supplemental select gate (in addition to using select gates 490a and 490b). Another embodiment will use memory cell 492 as a supplemental select gate (in addition to using select gates 490a and 490b).

The process of FIG. 5 can be performed multiple times throughout the life of a memory system. In some embodiments, the memory system may operate normally for a period of time prior to determining that a select gate has become abnormal. In such a situation, the system may store user data in the non-select gate memory cell (i.e. in one implementation or iteration of step 502) prior to converting that same non-select gate memory cell (or non-select gate device) to a select gate in step 506. Once the non-select gate memory cell/device has been converted to a select gate, it can no longer store user data. Therefore, if it was storing user data, that user data will be moved to another memory cell prior to converting the non-select gate memory cell to a select gate.

In one embodiment, the process of FIG. 5 is performed entirely on the memory chip 108 by control circuitry 110 at the direction of state machine 112. In another embodiment, the process of FIG. 5 is performed at the direction of controller 122. In another embodiment, any one or more control circuits (described above) can be used to implement the process of FIG. 5.

Figure 6:
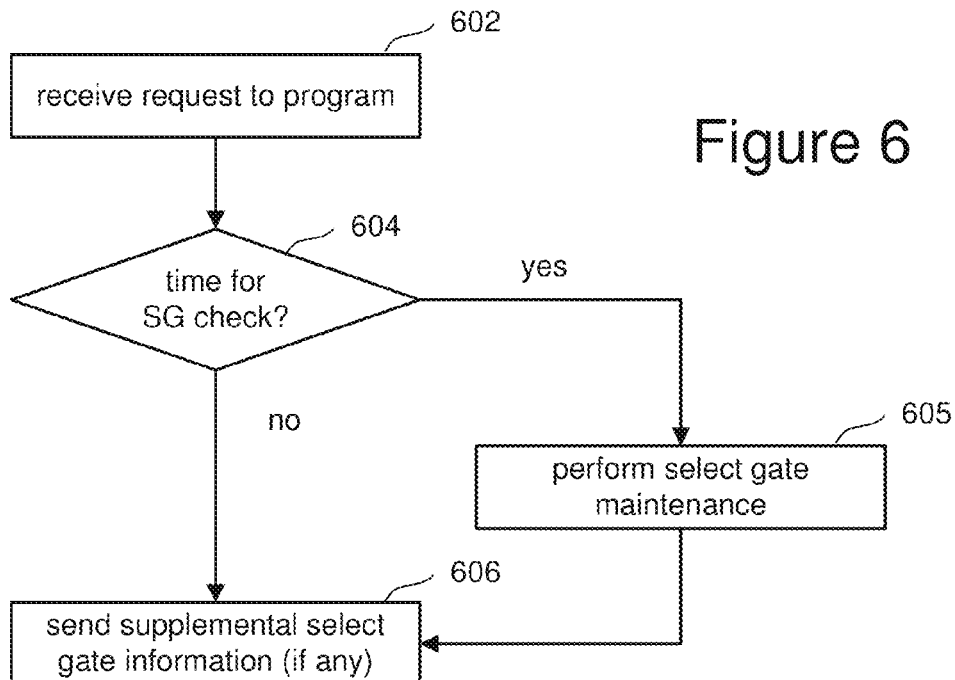
FIGS. 6 and 7 are flow charts describing one embodiment of operating non-volatile storage, and represent an example implementation of the process of FIG. 5.
Figure 7:
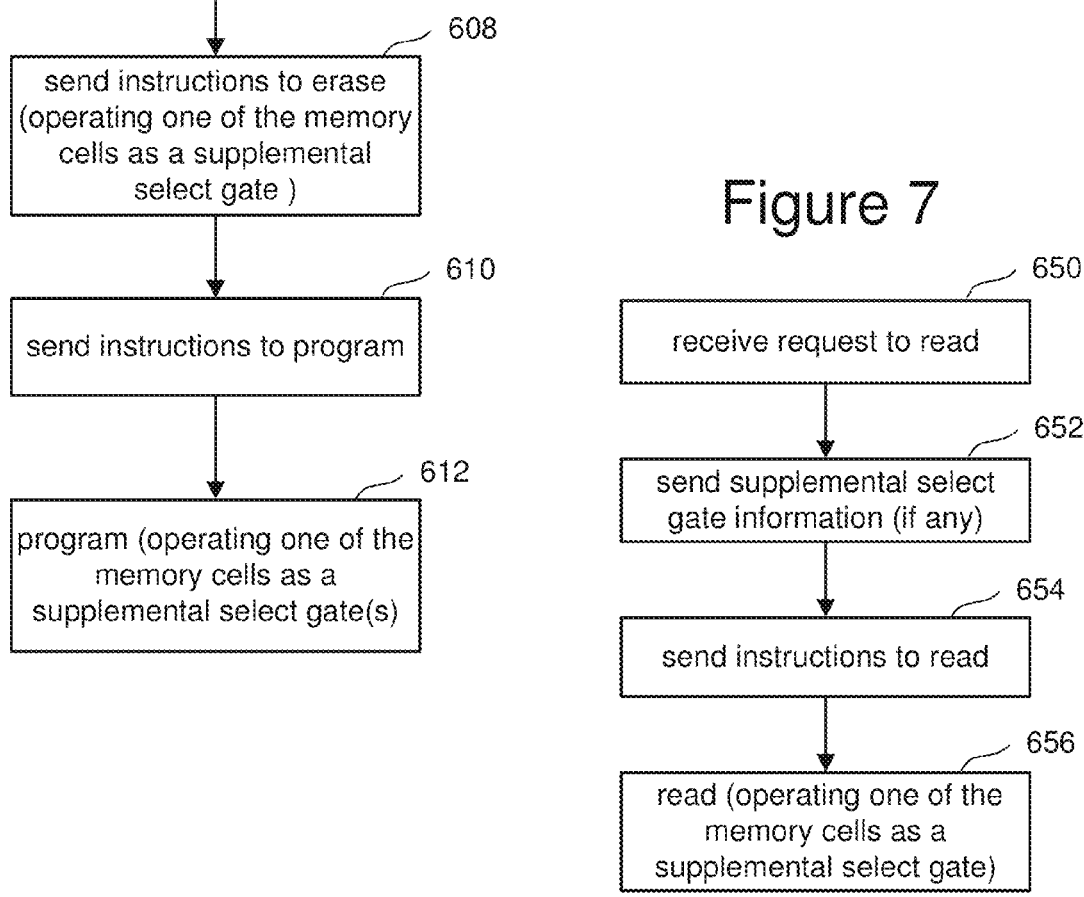

FIGS. 6 and 7 are flowcharts describing one embodiment of operating nonvolatile storage using the technology proposed herein, and represented example implementations of the process of FIG. 5 for the structure of FIGS. 1-4F. In one embodiment, the process of FIG. 6 is performed by controller 122. However, in an alternative embodiment, the process of FIG. 6 can be performed by state machine 112. In step 602, controller 122 receives a request to program data. That request may come from a host device. In one alternative, the request to program will be from the controller itself and, therefore, step 602 will include accessing an indication to program data from one or more processes running on controller 122. In step 604, controller 122 determines whether it is time to check the status/health of select gates. In one embodiment, the select gates are checked every X program-erase cycles (where X is an integer greater than 0). Examples include checking the status/health of the select gates every program-erase cycle, every 100 program-erase cycles, every 200 program-erase cycles, etc. If it is time to check the status/health of the select gates, then in step 605 select gate maintenance is performed. More details about the select gate maintenance process is described below with respect to FIG. 8A. Note that step 605 includes controller 122 instructing memory die 108 to perform the maintenance of the select gates. In other embodiments, controller 122 direct the performance of step 605. In some example implementations, the maintenance for the select gates will be performed on a finger basis, meaning that all the select gates for a particular finger will be checked at one time.

If it is not time to check the health/status of the select gates (step 604) or after performing such maintenance in step 605, the system will send supplemental select gate information (if any) to the memory die 108 in step 606. One embodiment of step 606 includes controller 122 informing memory die 108 of an indication of which memory non-select gate cells will be operating as select gates. This indication could include identifying the actual memory cells themselves or a combination of block, fingers and/or word lines. In step 608, controller 122 sends instructions to memory die 108 to erase a block of memory cells, which includes operating the memory cells identified in step 606 as a select gate. In some embodiments, the programming process will not require an erase step. In step 610, controller 122 sends instructions to memory die 108 to program data (in the block that was just erased), as well as the data to be programmed. In step 612, the data will be programmed (ie a memory operation), which includes operating the converted memory cells as supplemental select gates. More details of step 612 are described below with respect to FIG. 9. Note that since step 608 include erasing the entire block, then a memory cell that is converted to a select gate may have been erased, which would then require reconverting that non-select gate memory cell to a select gate again after the erasing (which will be discussed in more detail below).

FIG. 7 describes a process for reading. In step 650, controller 122 receive a request to read, or otherwise access an instruction (or indication) to read in a routine running on the controller 122. In step 652, controller 122 send indications of which memory cells are acting as supplemental select gates (if any). In step 654, controller 122 sends instructions to memory die 108 to perform a read operation. In step 656, memory die 108 performs a read process, which includes operating the converted memory cells as supplemental select gates.

Figure 8:
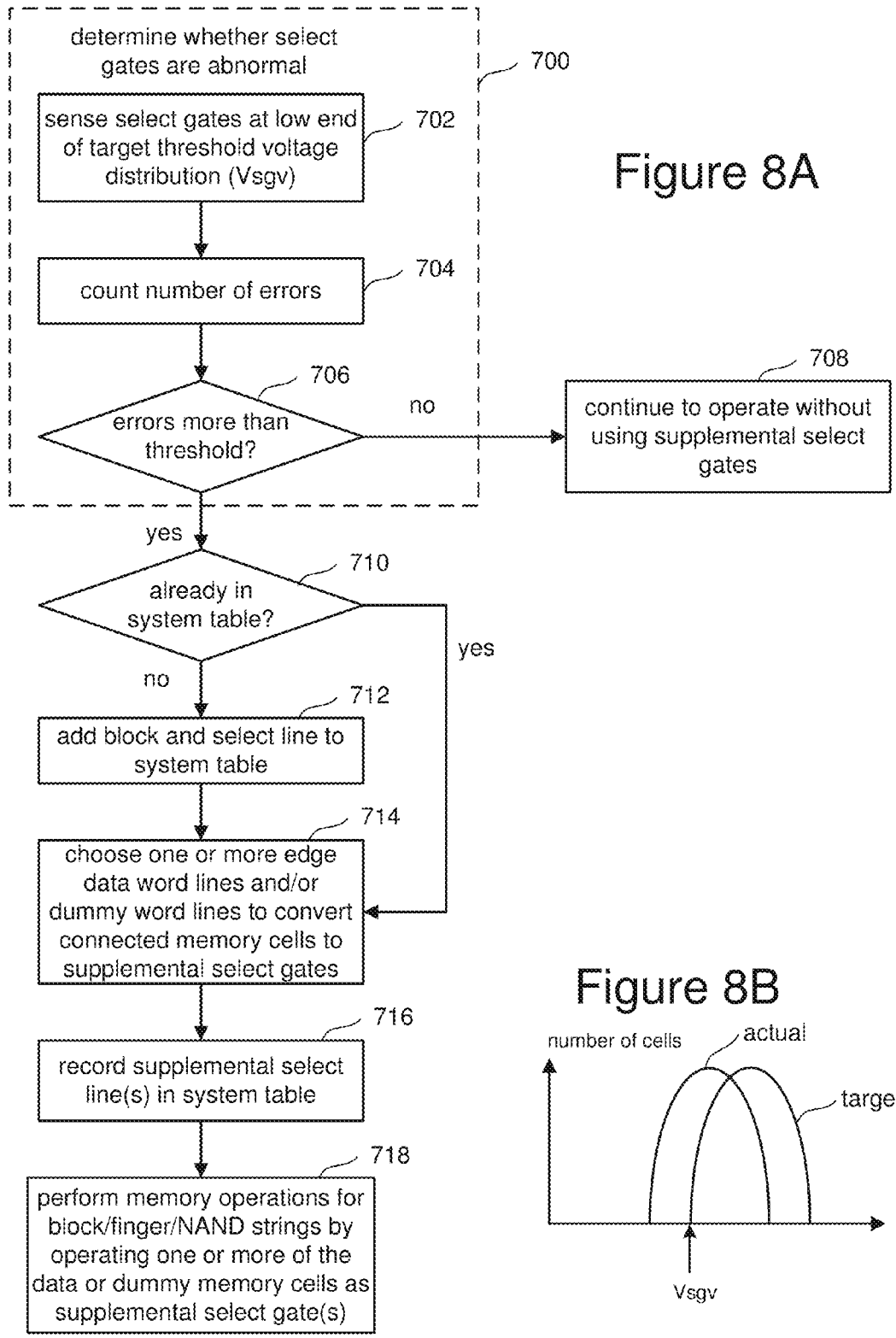
FIG. 8A is a flow chart describing one embodiment of a process for performing select gate maintenance.
FIG. 8B depicts two threshold voltage distributions.

FIG. 8A is a flowchart describing one embodiment of a process of performing the select gate maintenance. That is, the process of FIG. 8A is one example implementation of step 605 of FIG. 6. Step 700 includes determining whether select gates are abnormal. There are multiple embodiments for performing step 700. For example, the system could determine what the threshold voltage is for a select gate and, if that threshold voltage is not within a predetermined range of acceptable threshold voltages for select gates, then the select gate is determined to be abnormal. In another embodiment, the system can test whether the select gate threshold voltage is below a lower limit of acceptable threshold voltages. In another embodiment, the system can perform a read process for a NAND string or plurality of NAND strings. If the bit error rate is above a certain value, then it is assumed that the select gate is abnormal. In another embodiment, the system can perform current sensing on the select gate or the select line to determine whether the select gate is operating within specified requirements. Sub-steps 702-706 provide one example implementation that includes sensing an indication of a threshold voltage for the select gate in order to determine whether it is within a specified range of threshold voltages (i.e. in this case above a lower limit). In step 702, the select gates connected to a set of one or more select lines are sensed for a threshold voltage Vsgv that represent a low end of a target threshold voltage distribution for select gates. For example, FIG. 8B shows two threshold voltage distributions. One the threshold voltage distribution is labeled "target" and the other is labeled "actual." The threshold voltage distribution labelled "target" represents a predetermined range of acceptable threshold voltages for select gates. The threshold voltage distribution labeled "actual" is an example of measured threshold voltages of a set of select gates in a memory system that has been used for some period of time. One embodiment of step 702 includes performing sensing operations at Vsgv, which is the lower end of the target threshold voltage distribution by applying Vsgv to the select line and sensing whether the select gates turn on in response to the Vsg at their control gates (via the select line).

In step 704, the system counts the number of errors. That is every select gate that turns on in response to Vsgv being applied to its select line is considered abnormal, and counted as an error, because the select gate will turn on if its threshold voltage is below Vsgv. Select gates that do not turn on in response to Vsgv being applied to its select line are not an error because their threshold voltages are above Vsgv. Step 706 includes counting how many errors and determining whether the number of errors are greater than the threshold. If the errors are not greater than the threshold then the system will continue to operate without using any of the supplemental select gates described above in step 708. If the number of errors are greater than the threshold (step 706), the system will continue at step 710 as part of a process for converting non-select gates to select gates. Note that the embodiment of step 706 contemplates allowing for a small number of select gates to be abnormal, such that errors will exist in the system but will be fixed using error correction codes.

In other embodiments, the system will not use a non-zero threshold in step 706; therefore, any select gate that is found to be abnormal will be supplemented by converting a non-select gate to operate as a select gate as discussed herein. That is, step 706 will be replaced with a test that asks whether there are any errors. If no select gates are determined to be abnormal, then the process continues at step 708. If any select gates are determined to be abnormal, then the process continues at step 710.

In one embodiment, controller 122 maintains a data structure that is configured to store an indication of which memory cells are operating as supplemental select gates. For example, the data structure can store an indication of a word line being used as a supplemental select line as well as block that that word line is in. In other embodiments, the actual individual select gates can be identified. In one example implementation, the data structure is implemented as a table, such as system tables 156 (see FIG. 3A).

In step 710, the system determines whether the abnormal select gates are already inside system tables 156 (or other data structure). If this abnormal select gate is not in the system table already, then it is added to the system table in step 712. In one embodiment, the system will add the block and select line to the system table. In another embodiment, the system will indicate which exact select gate is abnormal on that select line. If the abnormal select gate is already in the table then step 712 is skipped and the process continues to step 714.

Figure 13:
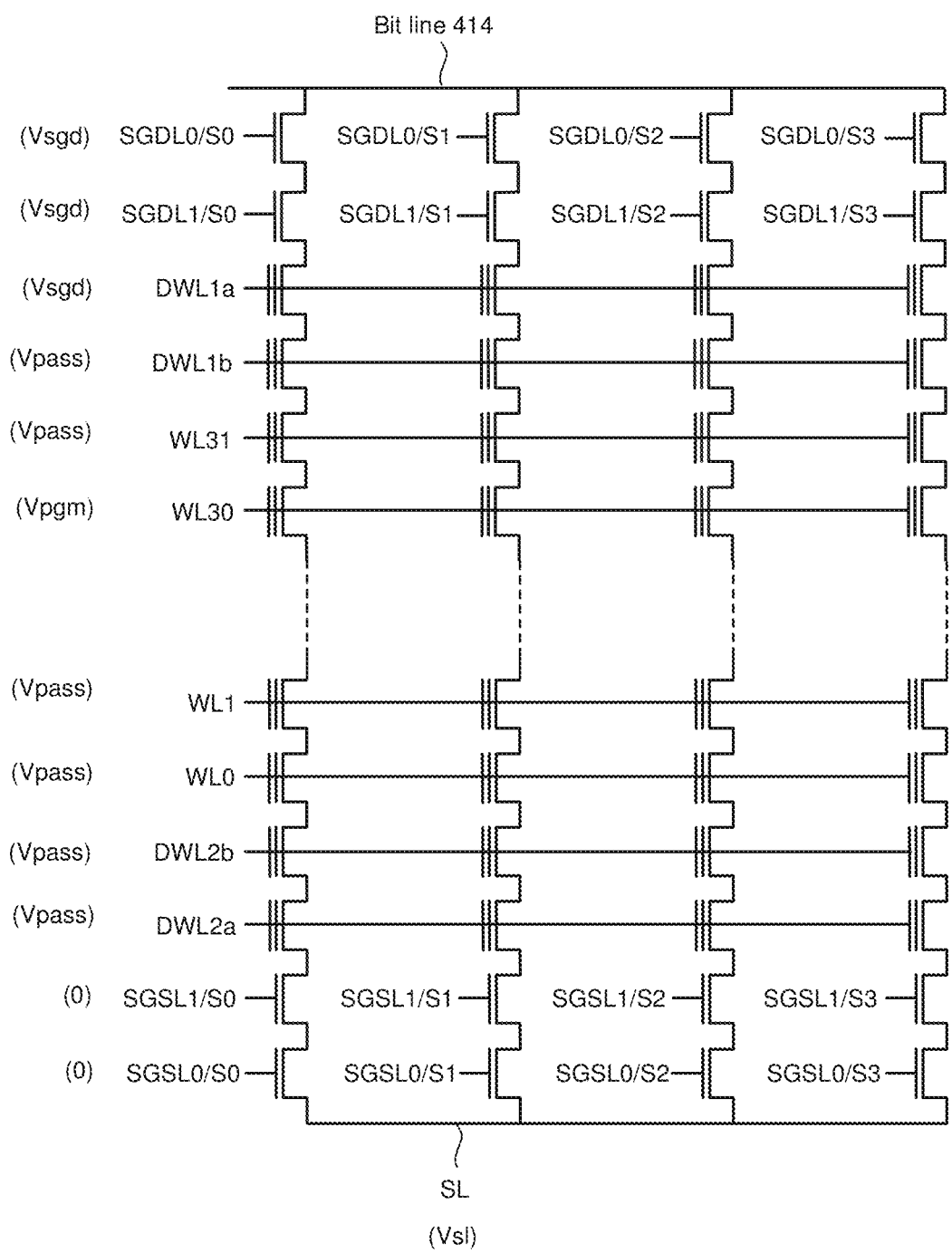
FIG. 13 is a schematic of a plurality of NAND strings depicting one embodiment that uses dummy memory cells as select gates.

To compensate for and/or supplement the abnormal select gate, the system will choose one or more edge data word lines (e.g. WL31 or WL0 from FIG. 16) or one or more dummy word lines for which to convert connected memory cells (non-select gate memory cells/devices) to supplemental select gates (see DWL1a of FIG. 13). In step 716, the chosen word lines and/or new supplemental select gates will be recorded in system table 156. In step 718, the system perform memory operations for the block/finger/NAND string by operating one or more data or dummy memory cells as supplemental select gates. In one embodiment, the actual converting of the non-select gates to become select gates is performed as part of step 714. In other embodiments, step 714 includes instructing the memory die 108 to do the conversion and the conversion is done later in step 612 (see FIG. 6). In one example implementation, the converting of a non-select gate memory cell to a select gate includes adjusting a threshold voltage with a non-select gate memory cell to be within the predetermined threshold voltage distribution for select gate memory cells (see "target" in FIG. 8B).

In another embodiment, if the number of errors for a given select line is above a predetermined threshold, then all of the NAND strings connected to that select line will have one of its memory cells (dummy or data) converted to become a supplemental select gate.

In one embodiment, the process of FIG. 8A is performed by a combination of controller 122 and control circuitry 110 (including state machine 112). In another embodiment, the process of FIG. 8A is performed on the memory die 108, without the use of controller 122. In one example implementation, controller 122 performs steps 704, 706, 710, 712, 714 and step 716, while memory die 108 (at the direction of state machine 112) perform step 702, 708 and 718.

Figures 9, 10:
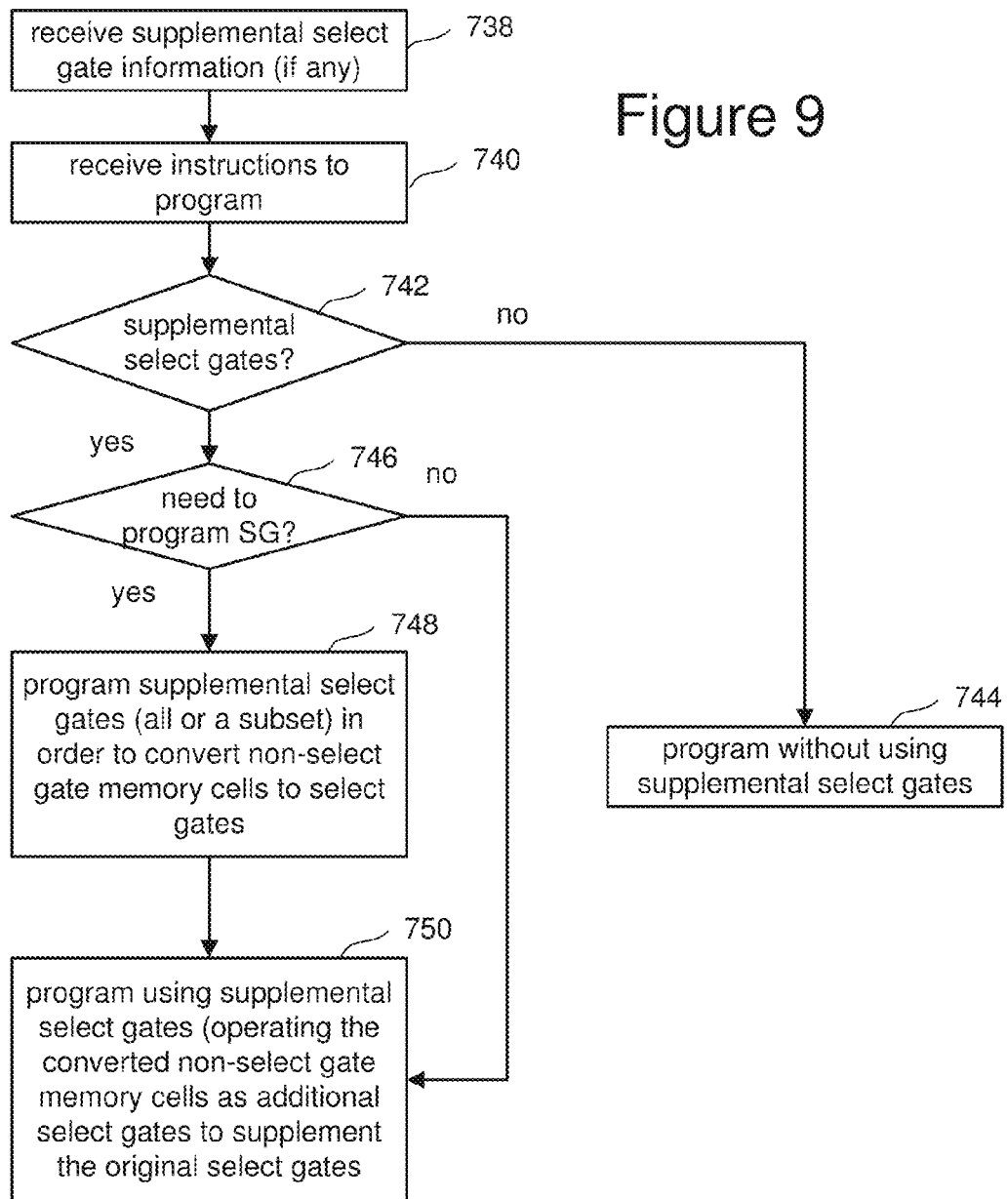
FIG. 9 is a flow chart describing one embodiment of a process performed when programming.
FIG. 10 depicts two threshold voltage distributions.

FIG. 9 is a flowchart describing one embodiment the process performed when programming. The process of FIG. 9 is an example implementation of step 612 of FIG. 6, which includes programming while operating one or more memory cells as supplemental select gates. The process of FIG. 9 is performed on memory die 108 at the direction of state machine 112 using the one or more control circuits discussed above. In step 738, memory die 108 receives the supplemental select gate information (if any). For example, step 738 is performed in response to step 606 of FIG. 6. In step 740, memory die 108 receives instructions to program. In one embodiment, step 740 is performed in response to step 610 of FIG. 6. If the instructions indicate that there are supplemental select gates to be used, and the process will do so starting at step 746. If there are no supplemental select gates to be used, then the process will continue at step 744 and perform programming without using any supplemental select gates. Step 744 can be implemented using a standard programming process known in the art.

In step 746, memory die 108 determines whether it needs to program a supplemental select gate. In step 738, the memory die 108 received indication of which non-select gate memory cells are to be operated as select gates. That indication may also indicate whether the non-select gate memory cells have already been converted to select gates or whether they have not been converted. Alternatively, the memory die 108 can keep track of which memory cells have been converted or the memory die can automatically detect whether the memory cells have been converted by sensing their threshold voltages. If they have not been converted, then they need to be converted now in step 748. If they have already been converted, then step 748 can be skipped and the memory die 108 can proceed to perform the programming of user data at step 750. That is, step 748 includes programming in order to convert a non-select gate memory cell to a select gate. Step 750 includes programming data using the supplemental select gates (operating the converted non-select gate memory cells as additional or supplemental select gates to supplement the original select gates). By supplementing the original select gates it is meant that the newly converted select gates will be used in addition to the original select gates or instead of the original select gates. Additionally, some embodiments use multiple select gates for NAND strings (see FIG. 4F) and the supplemental select gates could be used to replace only a subset of those original select gates or all of the original select gates.

Figure 11:
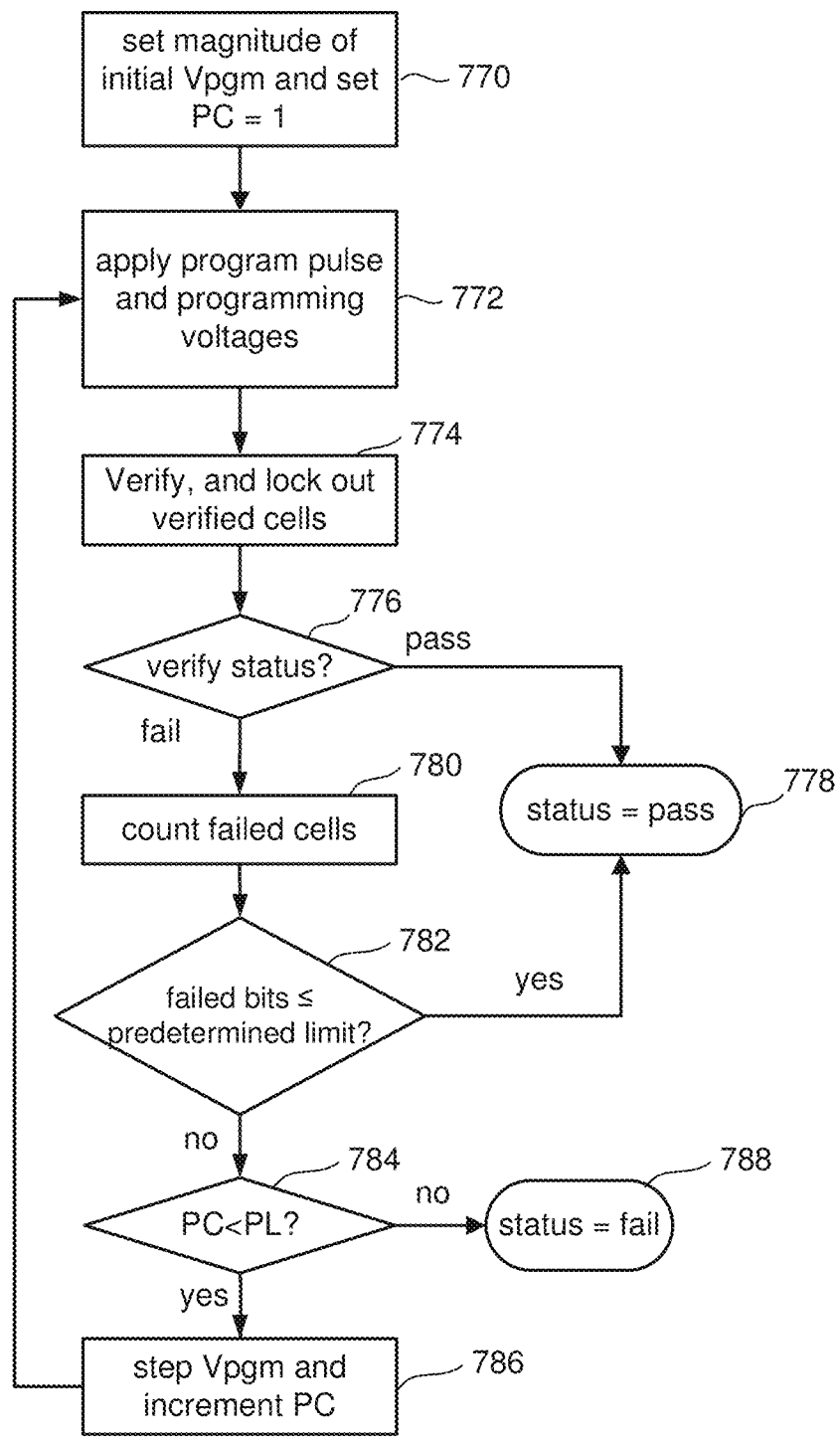
FIG. 11 is a flow chart describing one embodiment of a process for programming.

FIG. 11 is a flowchart describing one embodiment of a process for programming. The process of FIG. 11 can be used to implement step 744 of FIG. 9 which includes programming without using supplemental select gates. The process of FIG. 11 can also be used to implement step 748 of FIG. 9, which includes converting a non-select gate memory cell to a select gate by performing the programming of FIG. 11 on the non-select gate memory cell in order to convert its threshold voltage from the erased state (E of FIG. 10) to the threshold voltage distribution for select gates (SG of FIG. 10). The process of FIG. 11 can also be used to program memory cells as part of step 718. In one example embodiment, the process of FIG. 11 is performed on memory die 108 using the one or more control circuits discussed above, at the direction of state machine 112. When implementing step 744 and/or 750, the process of FIG. 11 will be operating on the data memory cells connected to word lines WL-WL31. When implementing step 748 of FIG. 9, the process of FIG. 11 will provide programming to the edge data word line or dummy word line chosen in step 714 to become a supplemental select line. When the process of FIG. 11 is implementing step 744 of FIG. 9 (standard programming) or step 748 of FIG. 9 (converting), standard voltages known in the art for programming are used to provide the programming to adjust the threshold voltages accordingly. However, when the process of FIG. 11 is performed to implement step 750 of FIG. 9 (programming using supplemental select gates), then a non-standard set of voltages are applied to the word line connected to the memory cells that are converted to select gates, and will be discussed in more detail with respect to FIG. 12.

Typically, the program voltage applied to the control gate during a program operation is applied as a series of program pulses. Between programming pulses are a set of verify pulses to perform verification. In many implementations, the magnitude of the program pulses is increased with each successive pulse by a predetermined step size. In step 770 of FIG. 11, the programming voltage (Vpgm) is initialized to the starting magnitude (e.g., ~12-16V or another suitable level) and a program counter PC maintained by state machine 112 is initialized at 1. In step 772, a program pulse of the program signal Vpgm is applied to the selected word line (the word line selected for programming). In one embodiment, the group of memory cells being programmed concurrently are all connected to the same word line (the selected word line). The unselected word lines receive one or more boosting voltages (e.g., ~7-11 volts) to perform boosting schemes known in the art. If a memory cell should be programmed, then the corresponding bit line is grounded. On the other hand, if the memory cell should remain at its current threshold voltage, then the corresponding bit line is connected to Vdd to inhibit programming In step 772, the program pulse is concurrently applied to all memory cells connected to the selected word line so that all of the memory cells connected to the selected word line are programmed concurrently. That is, they are programmed at the same time or during overlapping times (both of which are considered concurrent). In this manner all of the memory cells connected to the selected word line will concurrently have their threshold voltage change, unless they have been locked out from programming.

In step 774, the appropriate memory cells are verified using the appropriate set of target levels to perform one or more verify operations. In one embodiment, the verification process is performed by applying the testing whether the threshold voltages of the memory cells selected for programming have reached the appropriate verify reference voltage.

In step 776, it is determined whether all the memory cells have reached their target threshold voltages (pass). If so, the programming process is complete and successful because all selected memory cells were programmed and verified to their target states. A status of "PASS" is reported in step 778. If, in 776, it is determined that not all of the memory cells have reached their target threshold voltages (fail), then the programming process continues to step 780.

In step 780, the system counts the number of memory cells that have not yet reached their respective target threshold voltage distribution. That is, the system counts the number of memory cells that have, so far, failed the verify process. This counting can be done by the state machine, the controller, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state.

In step 782, it is determined whether the count from step 780 is less than or equal to a predetermined limit. In one embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 778. In this situation, enough memory cells programmed correctly such that the few remaining memory cells that have not been completely programmed can be corrected using ECC during the read process. In some embodiments, step 780 will count the number of failed cells for each sector, each target data state or other unit, and those counts will individually or collectively be compared to a threshold in step 782.

In another embodiment, the predetermined limit can be less than the number of bits that can be corrected by ECC during a read process to allow for future errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined Instead, it changes based on the number of errors already counted for the page, the number of program-erase cycles performed or other criteria.

If number of failed memory cells is not less than the predetermined limit, than the programming process continues at step 784 and the program counter PC is checked against the program limit value (PL). Examples of program limit values include 20 and 30; however, other values can be used. If the program counter PC is not less than the program limit value PL, then the program process is considered to have failed and a status of FAIL is reported in step 788. If the program counter PC is less than the program limit value PL, then the process continues at step 786 during which time the Program Counter PC is incremented by 1 and the program voltage Vpgm is stepped up to the next magnitude. For example, the next pulse will have a magnitude greater than the previous pulse by a step size (e.g., a step size of 0.1-0.4 volts). After step 786, the process loops back to step 772 and another program pulse is applied to the selected word line.

Figure 12:
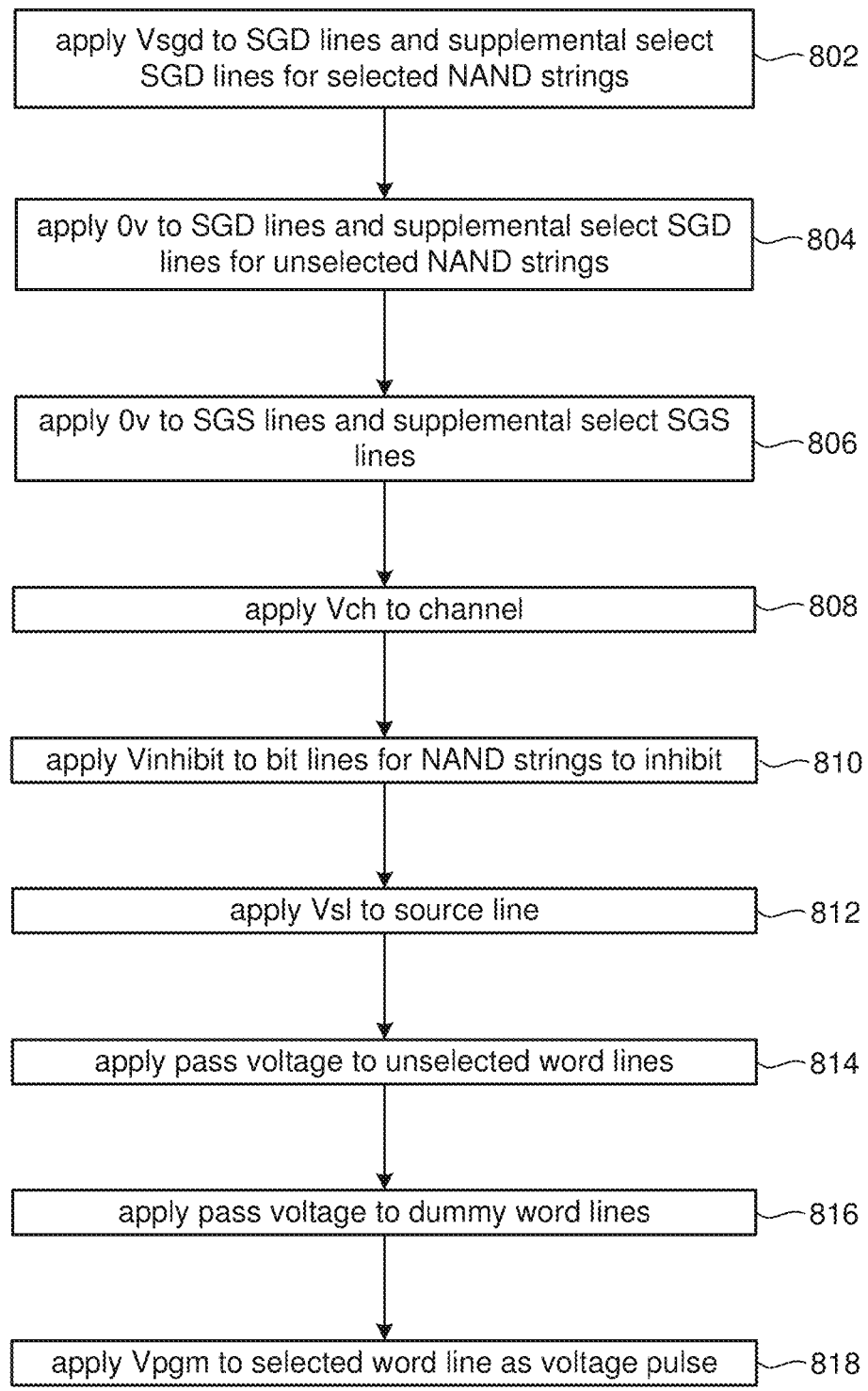
FIG. 12 is a flow chart describing one embodiment of a process for applying programming voltages during a programming process.

FIG. 12 is a flowchart describing one embodiment of a process for applying programming voltages during a programming process. For example, the process of FIG. 12 implements step 772 of FIG. 11 when the process of FIG. 11 is being used to implement step 750 of FIG. 9 (converting a non-select gate memory cell to a select gate). The process of FIG. 12 is performed using state machine 112, decoders 114, power control 116, and read-write circuits 128, as well as decoders 124 and 132.

In step 802 of FIG. 12, the system applies the voltage Vsgd to the drain side select lines (SGD lines) and to the supplemental select lines on the drain side for selected NAND strings. In step 804, the system applies zero volts to the drain side select lines and the supplemental select lines on the drain side for unselected NAND strings. In step 806, zero volts is applied to the source side select lines (SGS lines) and to the supplemental select lines on the source side. In step 808, the voltage Vch is applied to the channel. In one embodiment, Vch is floating so, therefore, the channels are floating. In step 810, the inhibit voltage Vinhibit is applied to bit lines for unselected NAND strings. In one embodiment, Vinhibit is 3.5 volts. In step 812, the voltage Vsl is applied to the source line. In one embodiment Vsl is equal to 3.5 volts (Vdd). In step 814, a pass voltage, Vpass (e.g. 7-10 volts), is applied to the unselected word lines. In step 816, Vpass is applied to the dummy word lines. In step 818, a program pulse, Vpgm, is applied to the selected word line.

FIGS. 13, 14, 15 and 16 are schematics of the same plurality of NAND strings depicted in FIG. 4F, demonstrating various example implementations of the technology proposed herein and described above. Specifically, FIGS. 13-16 show the voltages being applied to the various word lines and select lines during step 772 of FIG. 11 and during the process of FIG. 12.

In the example of FIG. 13, one of the drain side select gates has been determined to be abnormal. Dummy word line DWL1a is being used as a supplemental select line because one or more of the memory cells connected to DWL1a has been converted from a non-select gate memory cell to a select gate. Therefore, DWL1a will receive Vsgd (the same as the other select lines) rather than Vpass (which other dummy word lines receive). In an alternative embodiment, the memory array will include one or more switches that isolate the abnormal select gate from the memory cells of the NAND string. For example, if the select gate connected to SGDL1/S0 is determined to be abnormal, a first switch located between SGDL1/S0 and DWL1a and a second switch located between SGDL0/S0 and SGDL1/S0, which are connected together, can be used to bypass or otherwise isolate the select gate connected to SGDL1/S0.

Figure 14:
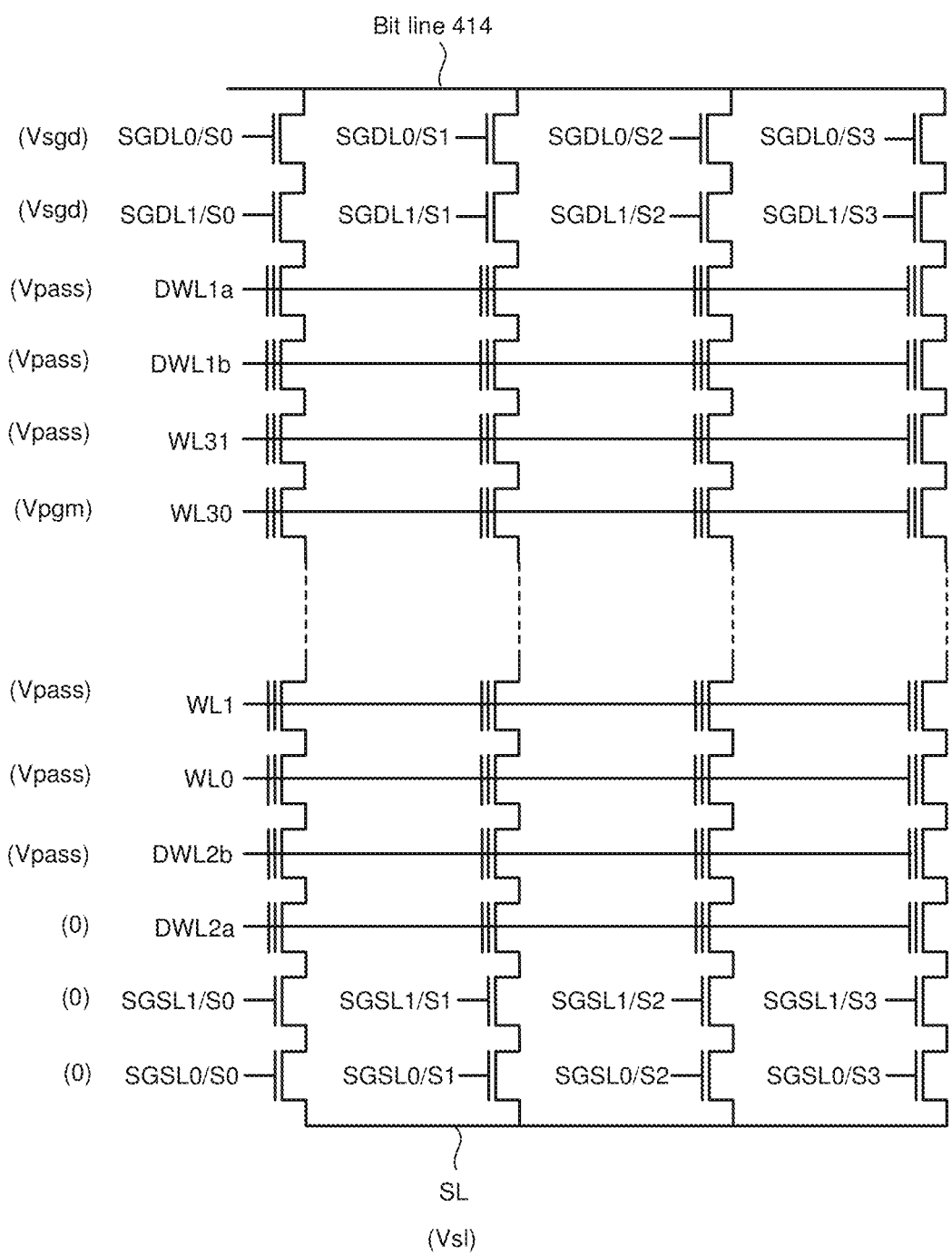
FIG. 14 is a schematic of a plurality of NAND strings depicting one embodiment that uses dummy memory cells as select gates.

In the embodiment of FIG. 14, one of the source side select lines has been determined to be abnormal. One or more of the select gates connected to DWL2a have been converted from non-select gate memory cells to select gates. Therefore, DWL2a is receiving zero volts (same as other source side select lines) rather than receiving Vpass (which the other dummy word lines are receiving).

Figure 15:
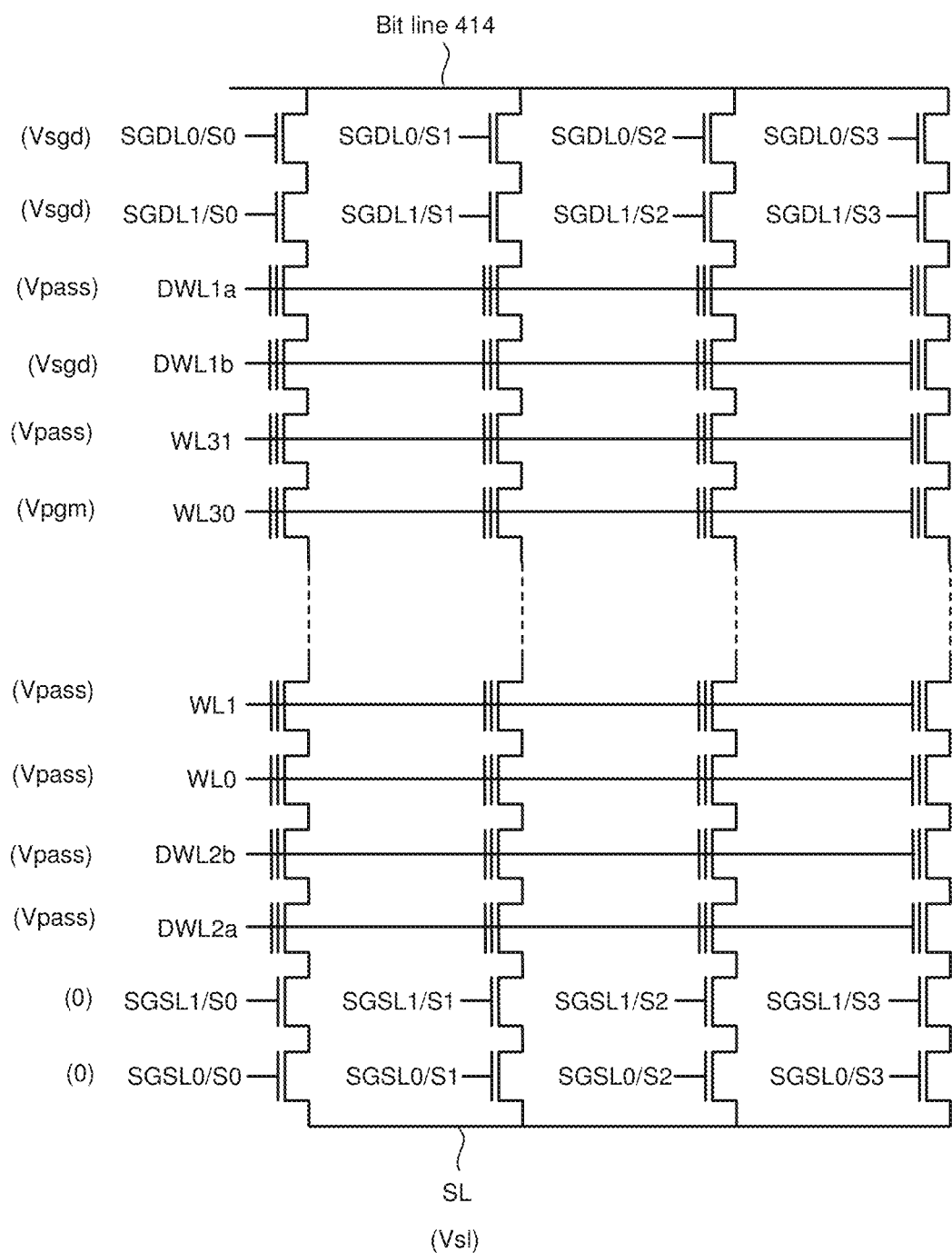
FIG. 15 is a schematic of a plurality of NAND strings depicting one embodiment that uses dummy memory cells as select gates.

FIG. 15 includes an example where one or more of the drain side select gates have been determined to be abnormal. One or more of the memory cells connected to dummy word line DWL1b have been converted from non-select gate memory cells to select gates. Therefore, DWL1b is receiving Vsgd (same as the other drain side select lines) rather than Vpass (like the other dummy word lines). In another alternative, the structure of FIG. 15 could also use word line WL31 as a supplemental select line so that memory cells connected to WL31 are converted to supplemental select gates (in addition to or instead of the memory cells connected to the dummy word lines), and WL31 receives Vsgd.

FIG. 16 provides an example where one or more of the drain side select gates have been determined to be abnormal. In this embodiment, there are no dummy word lines. WL31 is being used as a supplemental select line. One or more memory cells connected to WL31 have been converted from non-select gate memory cells to select gates. Therefore, during the programming process, WL31 is receiving Vsgd (the same as the other drain side select lines) rather than receiving Vpass (which is being received by all the other unselected word lines).

On embodiment comprises a group of non-volatile memory cells connected together; a select gate for the group of memory cells; and one or more control circuits in communication with the group of memory cells and the select gate, the one or more control circuits configured to determine that the select gate is abnormal and perform a memory operation for the group of memory cells by operating one of the memory cells as a supplemental select gate in response to determining that the select is gate is abnormal.

On embodiment comprises a plurality of groups of connected programmable and erasable non-volatile memory cells; a select line; a first plurality of select gates connected to the select line, each select gate of the plurality of select gates connected to a first side of one of the groups of memory cells, at least a first memory cell of each group of memory cells capable of operating as an additional select gate; and a data structure configured to store indications of which memory cells of the groups of memory cells function as additional select gates.

On embodiment includes a method, comprising converting a non-select gate memory cell to a select gate, the non-select gate memory cell is part of a plurality of programmable and erasable non-volatile memory cells connected to a first select gate; and performing a memory operation for the plurality of memory cells by operating the converted non-select gate memory cell as a replacement select gate for the plurality of memory cells.

On embodiment comprises memory cells arranged in NAND strings forming a three dimensional memory structure, each NAND string includes a plurality of programmable/erasable memory cells connected together and select gates; means for determining that the select gates are abnormal; means for converting programmable/erasable memory cells to operate as select gates; and means for performing a memory operation on the three dimensional memory structure by operating a converted memory cell as a select gate.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus comprising:
a group of non-volatile memory cells connected together;
a select gate for the group of memory cells;
one or more control circuits in communication with the group of memory cells and the select gate, the one or more control circuits configured to determine that the select gate is abnormal and perform a memory operation for the group of memory cells by operating one of the memory cells as a supplemental select gate in response to determining that the select gate is abnormal;
a plurality of word lines, the select gate and the group of non-volatile memory cells connected together form a first NAND string, the plurality of word lines are connected to the first NAND string;
additional NAND strings connected to the word lines; and
a select line connected to the select gate, the additional NAND strings each include an additional select gate connected to the select line, the one or more control circuits are configured to determine whether the additional select gates connected to the select line are abnormal, the one or more control circuits are configured to convert to select gates a non-select gate memory cell of each NAND string that includes a select gate determined to be abnormal, non-select gate memory cells are not converted to select gates for NAND strings that are not determined to have a select gate that is abnormal.

2. The apparatus of claim 1, wherein:
the one or more control circuits are configured to determine that the select gate is abnormal by sensing an indication of a threshold voltage of the select gate.

3. The apparatus of claim 1, wherein:
the one or more control circuits are configured to determine that the select gate is abnormal by determining whether a threshold voltage of the select gate is in a predetermined range.

4. The apparatus of claim 1, wherein:
the one or more control circuits are configured to convert the one of the memory cells from a non-select gate device to a select gate.

5. The apparatus of claim 1, wherein:
the one or more control circuits are configured to determine that the select gate is abnormal by determining whether a threshold voltage of the select gate is in a predetermined range; and
the one or more control circuits are configured to convert the one of the memory cells from a non-select gate device to a select gate by programming a threshold voltage for the one of the memory cells to a magnitude within the predetermined range.

6. The apparatus of claim 1, wherein:
the one of the memory cells operated as a supplemental select gate is positioned to be a dummy memory cell in the NAND string.

7. The apparatus of claim 1, wherein:
the one of the memory cells operated as a supplemental select gate is positioned to be a user data memory cell in the NAND string.

8. The apparatus of claim 1, wherein:
the one or more control circuits are configured to test whether the select gate is abnormal every X program-erase cycles, where X is an integer greater than 0.

9. The apparatus of claim 1, wherein:
the group of non-volatile memory cells connected together form a NAND string in a three dimensional memory structure.

10. The apparatus of claim 1, further comprising:
one or more switches that isolate the abnormal select gate from the group of non-volatile memory cells connected together.

11. An apparatus comprising:
a plurality of groups of connected programmable and erasable non-volatile memory cells;
a select line;
a first plurality of select gates connected to the select line, each select gate of the plurality of select gates connected to a first side of one of the groups of memory cells, at least a first memory cell of each group of memory cells capable of operating as an additional select gate;
a data structure configured to store indications of which memory cells of the groups of memory cells function as additional select gates; and
one or more control circuits in communication with the plurality of group of memory cells as well as the select line and the select gates, the one or more control circuits are configured to access an indication to program data, determine whether it is time to perform select gate maintenance, test whether the select gates are in an unintended condition, update the data structure based on the test, convert the first memory cell for each group of memory cells to a select gate for those groups of memory cells connected to select gates that are in the unintended condition and perform memory operations by operating the converted first memory cells as supplemental select gates.

12. An apparatus comprising:
a plurality of groups of connected programmable and erasable non-volatile memory cells;
a select line;
a first plurality of select gates connected to the select line, each select gate of the plurality of select gates connected to a first side of one of the groups of memory cells, at least a first memory cell of each group of memory cells capable of operating as an additional select gate;
a data structure configured to store indications of which memory cells of the groups of memory cells function as additional select gates; and
one or more control circuits in communication with the plurality of group of memory cells as well as the select line and the select gates, the one or more control circuits are configured to sense whether the select gates have a threshold voltage above a predetermined magnitude, count how many select gates do not have a threshold voltage above the predetermined magnitude, update the data structure if the select line is not indicated in the data structure, choose a word line to be a supplemental select line and convert at least a subset of memory cells connected to the word line to select gates, the subset of memory cells are in the groups of memory cells.

13. An apparatus comprising:
a group of non-volatile memory cells connected together;
a select gate for the group of memory cells;
one or more control circuits in communication with the group of memory cells and the select gate, the one or more control circuits configured to determine that the select gate is not operating in an intended manner and perform a memory operation for the group of memory cells by operating one of the memory cells as a supplemental select gate in response to determining that the select gate is not operating in the intended manner;
a plurality of word lines, the select gate and the group of non-volatile memory cells connected together form a first NAND string, the plurality of word lines are connected to the first NAND string;
additional NAND strings connected to the word lines; and
a select line connected to the select gate, the additional NAND strings each include an additional select gate connected to the select line, the one or more control circuits are configured to determine whether the additional select gates connected to the select line are not operating in the intended manner, if the number of additional select gates is above a predetermined threshold then the one or more control circuits are configured to convert to select gates a non-select gate memory cell of each NAND string connected to the select line.

14. The apparatus of claim 13, wherein:
the one or more control circuits are configured to determine that the select gate is not operating in the intended manner by sensing an indication of a threshold voltage of the select gate.

15. The apparatus of claim 13, wherein:
the one or more control circuits are configured to convert the one of the memory cells from a non-select gate device to a select gate.

16. The apparatus of claim 13, wherein:
the one or more control circuits are configured to determine that the select gate is a not operating in the intended manner by determining whether a threshold voltage of the select gate is in a predetermined range; and
the one or more control circuits are configured to convert the one of the memory cells from a non-select gate device to a select gate by programming a threshold voltage for the one of the memory cells to a magnitude within the predetermined range.

17. The apparatus of claim 13, wherein:
the one of the memory cells operated as a supplemental select gate is positioned to be a dummy memory cell in the NAND string.

18. The apparatus of claim 13, wherein:
the one of the memory cells operated as a supplemental select gate is positioned to be a user data memory cell in the NAND string.

19. The apparatus of claim 13, wherein:
the one or more control circuits are configured to test whether the select gate is not operating in the intended manner every X program-erase cycles, where X is an integer greater than 0.

20. The apparatus of claim 13, wherein:
the group of non-volatile memory cells connected together form a NAND string in a three dimensional memory structure.

* * * * *

UNITED STATES PATENT AND TRADEMARK OFFICE
CERTIFICATE OF CORRECTION

PATENT NO. : 9,715,938 B2
APPLICATION NO. : 14/860224
DATED : July 25, 2017
INVENTOR(S) : Yang et al.

It is certified that error appears in the above-identified patent and that said Letters Patent is hereby corrected as shown below:

Column 22, Line 3, (Claim 16, Line 3): After "is" and before "not" delete "a".

Signed and Sealed this
Twenty-second Day of May, 2018

Andrei Iancu
*Director of the United States Patent and Trademark Office*